United States Patent
Matsuda et al.

(10) Patent No.: US 12,204,001 B2
(45) Date of Patent: Jan. 21, 2025

(54) GRADIENT MAGNETIC FIELD SENSOR AND MAGNETIC MATTER DETECTION DEVICE

(71) Applicant: TDK CORPORATION, Tokyo (JP)

(72) Inventors: Atsushi Matsuda, Tokyo (JP); Yosuke Nagakubo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 133 days.

(21) Appl. No.: 18/013,453

(22) PCT Filed: Jul. 7, 2021

(86) PCT No.: PCT/JP2021/025623
§ 371 (c)(1),
(2) Date: Dec. 28, 2022

(87) PCT Pub. No.: WO2022/014438
PCT Pub. Date: Jan. 20, 2022

(65) Prior Publication Data
US 2023/0258744 A1 Aug. 17, 2023

(30) Foreign Application Priority Data
Jul. 17, 2020 (JP) .................................. 2020-122886

(51) Int. Cl.
*G01R 33/022* (2006.01)
*G01R 33/028* (2006.01)

(52) U.S. Cl.
CPC ......... *G01R 33/022* (2013.01); *G01R 33/028* (2013.01)

(58) Field of Classification Search
None
See application file for complete search history.

(56) References Cited

FOREIGN PATENT DOCUMENTS

| JP | 2019-002688 A | 1/2019 | |
|---|---|---|---|
| WO | WO-2015060344 A1 * | 4/2015 | ........... G01R 33/022 |

OTHER PUBLICATIONS

Translation of Mar. 5, 2024 Office Action issued in Japanese Patent Application No. 2020-122886.
Oct. 5, 2021 International Search Report issued in Patent Application No. PCT/JP2021/025623.

* cited by examiner

*Primary Examiner* — Jas A Sanghera
(74) *Attorney, Agent, or Firm* — Oliff PLC

(57) ABSTRACT

A gradient magnetic field sensor includes: an AC power supply connection terminal to which a first power supply terminal included in an AC power supply is connected; a first magnetic core connected between the connection terminal and the ground; a second magnetic core connected in parallel with the first magnetic core between the connection terminal and ground; an AC current control unit connected between the connection terminal and at least one of the first magnetic core and the second magnetic core and configured to control an AC current flowing through at least one of the first and second magnetic core; a first detection coil wound around the first magnetic core; a second detection coil wound around second magnetic core and differentially-connected with the first detection coil; and a detection circuit that detects a voltage difference between first voltage output from first detection coil and second voltage output from the second.

13 Claims, 10 Drawing Sheets

GRADIENT MAGNETIC FIELD SENSOR AND MAGNETIC MATTER DETECTION DEVICE

TECHNICAL FIELD

The present invention relates to a gradient magnetic field sensor and a magnetic matter detection device.

Priority is claimed on Japanese Patent Application No. 2020-122886, filed Jul. 17, 2020, the content of which is incorporated herein by reference.

BACKGROUND ART

Gradient magnetic field sensors detecting a gradient of intensities of magnetic fields at two different points have been researched and developed. Here, the gradient is a difference between intensities of magnetic fields at two different points.

In order to detect intensities of magnetic fields at two different points, the gradient magnetic field sensor includes two sensor heads. In the gradient magnetic field sensor, one of these two sensor heads detects an intensity of a magnetic field at one of these two different points. In addition, in the gradient magnetic field sensor, the other of these two sensor heads detects an intensity of a magnetic field at the other of these two different points. Then, the gradient magnetic field sensor detects a gradient of intensities of magnetic fields at these two different points in accordance with signals output from these two sensor heads. The gradient of intensities of magnetic fields at these two different points changes in accordance with presence/absence of an object that can change magnetic fields. By using this, for such an object set as a detection target object, the gradient magnetic field sensor can detect the detection target object.

Here, as described above, the gradient magnetic field sensor detects a gradient of intensities of magnetic fields at two different points. Meanwhile, inside a uniform magnetic field area, the intensities of magnetic fields at the same time are the same at all points. For this reason, the gradient magnetic field sensor detects no gradient of intensities of magnetic fields inside the area. In this specification, the uniform magnetic field area is an area in which a uniform magnetic field is applied and is an area in which a magnetic field other than the uniform magnetic field is not applied. In addition, in this specification, a uniform magnetic field applied to the inside of a certain area is a magnetic field of which the intensity uniformly changes inside the area without being dependent on a point.

However, two sensor heads included in a gradient magnetic field sensor frequently have a large individual difference and have mutually different sensitivities. For this reason, even inside a uniform magnetic field area, a gradient magnetic field sensor may detect a gradient of intensities of a magnetic field. Such sensitivities being mutually different may cause reduction of detection accuracy in detection of presence/absence of a detection target object and thus is not desirable.

In relation to this, a gradient magnetic field sensor that includes two sensor heads in which a DC excitation current and an AC excitation current flow in series and is able to adjust sensitivities of the two sensor heads by adjusting amounts of DC excitation currents flowing through the two sensor heads is known (see Patent Document 1).

CITATION LIST

Patent Document

[Patent Document 1]
Japanese Unexamined Patent Application, First Publication No. 2019-002688

SUMMARY OF INVENTION

Technical Problem

Here, each of two sensor heads included in a gradient magnetic field sensor as disclosed in Patent Document 1 is configured using a magnetic core in which an AC excitation current flows together with a DC excitation current and a detection coil in which a voltage is induced in accordance with a magnetic field generated from the magnetic core. The detection coils of the two sensor heads are differentially connected. For this reason, inside a uniform magnetic field area, in a case in which sensitivities of the two sensor heads are the same, amplitudes of voltages induced in the two detection coils are the same. As a result, in this case, inside the area, when phases of voltages induced in the two detection coils are opposite phases, the voltages offset each other.

However, even in a case in which sensitivities of the two sensor heads included in the gradient magnetic field sensor as disclosed in Patent Document 1 are the same, there are cases in which phases of voltages induced in the two detection coils inside a uniform magnetic field area may not be opposite phases. In other words, in the case, there are cases in which voltages induced in the two detection coils inside the area do not offset each other. This represents that the gradient magnetic field sensor detects a gradient of intensities of the magnetic field even inside this area, which is not desirable. Examples of reasons for the phases of the voltages induced in the two detection coils not being opposite phases include an influence of magnetic coupling in a magnetic circuit including the two sensor heads, non-uniformity of magnetic characteristics of the magnetic core of each of the two sensor heads, and the like.

The present invention is in consideration of such situations, and an object thereof is to provide a gradient magnetic field sensor and a magnetic matter detection device capable of improving accuracy of detection of a detection target object using a magnetic field.

Solution to Problem

According to one aspect of the present invention, there is provided a gradient magnetic field sensor including: an AC power supply connection terminal to which a first power supply terminal included in an AC power supply is connected; a first magnetic core connected between the AC power supply connection terminal and the ground; a second magnetic core connected in parallel with the first magnetic core between the AC power supply connection terminal and the ground; an AC current control unit connected between the AC power supply connection terminal and at least one of the first magnetic core and the second magnetic core and configured to control an AC current flowing through at least one of the first magnetic core and the second magnetic core; a first detection coil wound around the first magnetic core; a second detection coil wound around the second magnetic core and differentially connected with the first detection coil; and a detection circuit configured to detect a voltage corresponding to a difference between a first voltage output from the first detection coil and a second voltage output from the second detection coil.

Advantageous Effects of Invention

According to the present invention, accuracy of detection of a detection target object using a magnetic field can be improved.

DESCRIPTION OF EMBODIMENTS

Embodiment

Figure 1:
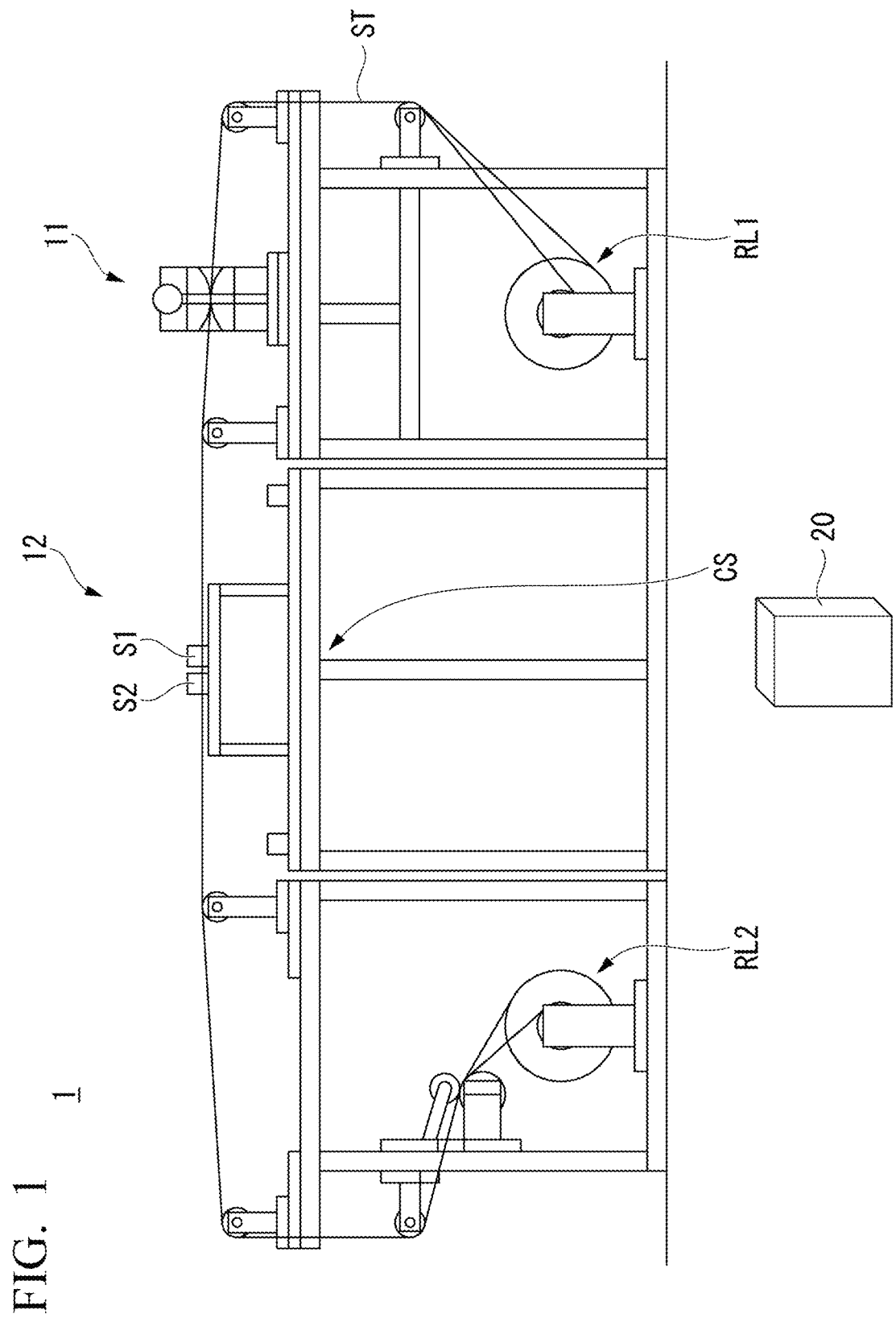
FIG. 1 is a diagram illustrating an example of a configuration of a magnetic matter detection device 1.

Hereinafter, an embodiment of the present invention will be described with reference to the drawings.
<Overview of Magnetic Matter Detection Device>

First, an overview of a magnetic matter detection device according to this embodiment will be described.

A magnetic matter detection device according to an embodiment includes a gradient magnetic field sensor according to an embodiment. The gradient magnetic field sensor according to the embodiment includes an AC power supply connection terminal, a first magnetic core, a second magnetic core, an AC current control unit, a first detection coil, a second detection coil, and a detection circuit. Here, the AC power supply connection terminal is a terminal to which a first power supply terminal included in an AC power supply is connected. The first magnetic core is connected between the AC power supply connection terminal and the ground. The second magnetic core is connected between the AC power supply connection terminal and the ground in parallel with the first magnetic core. The AC current control unit is connected between the AC power supply connection terminal and at least one of the first magnetic core and the second magnetic core. The AC current control unit configured to controls an AC current flowing through at least one of the first magnetic core and the second magnetic core. The first detection coil is wound around the first magnetic core. The second detection coil is wound around the second magnetic core. The second detection coil is differentially connected together with the first connection coil. The detection circuit is a circuit that detects a voltage corresponding to a difference between a first voltage output from the first detection coil and a second voltage output from the second detection coil.

In this way, the gradient magnetic field sensor according to the embodiment and the magnetic matter detection device according to the embodiment can inhibit detection of a gradient of intensities of a magnetic field inside a uniform magnetic field area, and as a result, can improve accuracy of detection of a detection target object using a magnetic field.

Hereinafter, a configuration of each of the magnetic matter detection device according to the embodiment and the gradient magnetic field sensor according to the embodiment will be described in detail.
<Configuration of Magnetic Matter Detection Device>

Hereinafter, the configuration of the magnetic matter detection device according to the embodiment will be described using a magnetic matter detection device 1 as one example of the magnetic matter detection device as an example. Here, in the embodiment, a conductor transmitting an electric signal corresponding to DC power or an electric signal corresponding to AC power will be referred to as a transmission line in description. For example, the transmission line may be a conductor printed on a board, a conductive wire acquired by forming a conductor in a linear shape, or any other conductor. In addition, in the embodiment, reference to a voltage represents an electric potential difference from an electric potential serving as a predetermined reference, and illustration and description of the electric potential serving as the reference will be omitted. Here, the electric potential serving as the reference may be any electric potential. In the embodiment, as an example, a case in which the electric potential serving as the reference is a ground electric potential will be described. In addition, in the embodiment, reference to the ground represents the same ground.

FIG. 1 is a diagram illustrating an example of the configuration of the magnetic matter detection device 1.

The magnetic matter detection device 1 is a device that detects a detection target object using a magnetic field. Here, the detection target object is an object that is able to change a magnetic field and, for example, is magnetic matter.

For example, the magnetic matter detection device 1 includes a gradient magnetic field sensor 12 that includes a frame body CS, a first roller RL1, a second roller RL2, a magnetization device 11, and two sensor heads including a first sensor head S1 and a second sensor head S2 and an information processing device 20. In FIG. 1, in order to prevent complication of the drawing, cables connecting the information processing device 20 and the other members in the magnetic matter detection device 1 are omitted. In addition, the magnetic matter detection device 1 may be configured not to include at least one of the frame body CS, the first roller RL1, the second roller RL2, the magnetization device 11, and the information processing device 20. In addition, the magnetic matter detection device 1 may be configured to include other members, other devices, and the like together with the gradient magnetic field sensor 12 in place of at least one of the frame body CS, the first roller RL1, the second roller RL2, the magnetization device 11, and the information processing device 20. Furthermore, the magnetic matter detection device 1 may be configured to include other members, other devices, and the like together with the gradient magnetic field sensor 12 in addition to all of the frame body CS, the first roller RL1, the second roller RL2, the magnetization device 11, and the information processing device 20.

Each member of the magnetic matter detection device 1 may be mounted in the frame body CS. The frame body CS is mainly configured of a top plate that is not illustrated, a bottom plate that is not illustrated, and a plurality of support poles connecting the top plate and the bottom plate. In the example illustrated in FIG. 1, an external shape of the frame body CS is an approximately rectangular parallelepiped shape. In addition, the external shape of the frame body CS may be any shape.

The first roller RL1 and the second roller RL2 are disposed in the frame body CS.

The first roller RL1 is a roller in which a sheet member ST that is a target for testing for the presence/absence of attachment of a detection target object is wound in a roll shape. The second roller RL2 is a roller that winds the sheet member ST drawn from the first roller RL1 while conveying the sheet member ST along a predetermined path. The second roller RL2 is rotated by a servo motor or the like that is not illustrated in the drawing. In accordance with this, the second roller RL2 can wind the sheet member ST drawn from the first roller RL1. In other words, the second roller RL2 is a driving roller. The first roller RL1 is a manual roller that rotates while the sheet member ST is wound in accordance with rotation of the second roller RL2. For example, the servo motor is controlled by the information processing device 20 to be described below.

The sheet member ST is conveyed inside a magnetic field generated by the magnetization device 11 while until the sheet member is drawn from the first roller RL1 and is wound around the second roller RL2. In accordance with this, a detection target object attached to the sheet member ST is magnetized. After being conveyed inside the magnetic field, the sheet member ST is conveyed to a predetermined detection area in which the gradient magnetic field sensor 12 can detect the presence/absence of a detection target object. Then, the sheet member ST is wound around the second roller RL2.

Here, the magnetization device 11 is a device that generates a magnetic field of a predetermined intensity in a predetermined magnetization area and magnetizes a magnetic body that has entered the inside of the magnetization area. Since the magnetization device 11 is a known device, further detailed description thereof will be omitted.

By using sensor heads disposed at two different points in the detection area described above, that is, the first sensor head S1 and the second sensor head S2, the gradient magnetic field sensor 12 detects a gradient of intensities of a magnetic field at the two different points. In accordance with this, the information processing device 20 acquiring a detection signal output from the gradient magnetic field sensor 12 can determine whether or not a detection target object is attached to a sheet member ST conveyed to a detection area based on the detection signal. Hereinafter, for the convenience of description, a gradient of intensities of a magnetic field at two points including a point at which the first sensor head S1 is disposed and a point at which the second sensor head S2 is disposed will be simply referred to as a gradient in description.

The information processing device 20 is connected to the gradient magnetic field sensor 12 to be able to communicate therewith. As described above, the information processing device 20 determines whether or not a detection target object is attached to the sheet member ST conveyed to the detection area based on a detection signal output from the gradient magnetic field sensor 12.

For example, in a case in which it is determined that a detection target object is attached to a sheet member ST conveyed to the detection area, the information processing device 20 stops winding of the sheet member ST using the second roller RL2 by controlling the servo motor described above and performs a notification process of notifying of attachment of a detection target object to the sheet member ST. For example, the notification process is a process of causing a display of the information processing device 20 to display information indicating attachment of a detection target object to the sheet member ST. In accordance with this, a user of the magnetic matter detection device 1 can perform removal of the detection target object from the sheet member ST, identification of the sheet member ST as a defective product, and the like. In addition, the notification process may be a process of outputting a sound/voice, a vibration, light, or the like representing the information instead of such a display process.

For example, the information processing device 20 is a notebook PC (Personal Computer), a tablet PC, a desktop PC, a workstation, a multi-functional mobile phone terminal (smartphone), a mobile phone terminal, a PCA (Personal Digital Assistant), or the like. In addition, the information processing device 20 may be another information processing device such as a microcomputer.

In addition, in the magnetic matter detection device 1, at least one of the magnetization device 11, the gradient magnetic field sensor 12, and the information processing device 20 may be integrally configured.

In addition, a target for which the magnetic matter detection device 1 performs a test of attachment of a detection target object may be another object for which the presence/absence of a detection target object can be tested instead of the sheet member ST. For example, a magnetic matter detector including the gradient magnetic field sensor 12 detects the presence/absence of magnetic matter in the ground. In this case, the magnetic matter detector is an example of the magnetic matter detection device 1. The magnetic matter in the ground is an example of a detection target object in that case.

<Circuit Configuration of Gradient Magnetic Field Sensor>

Figure 2:
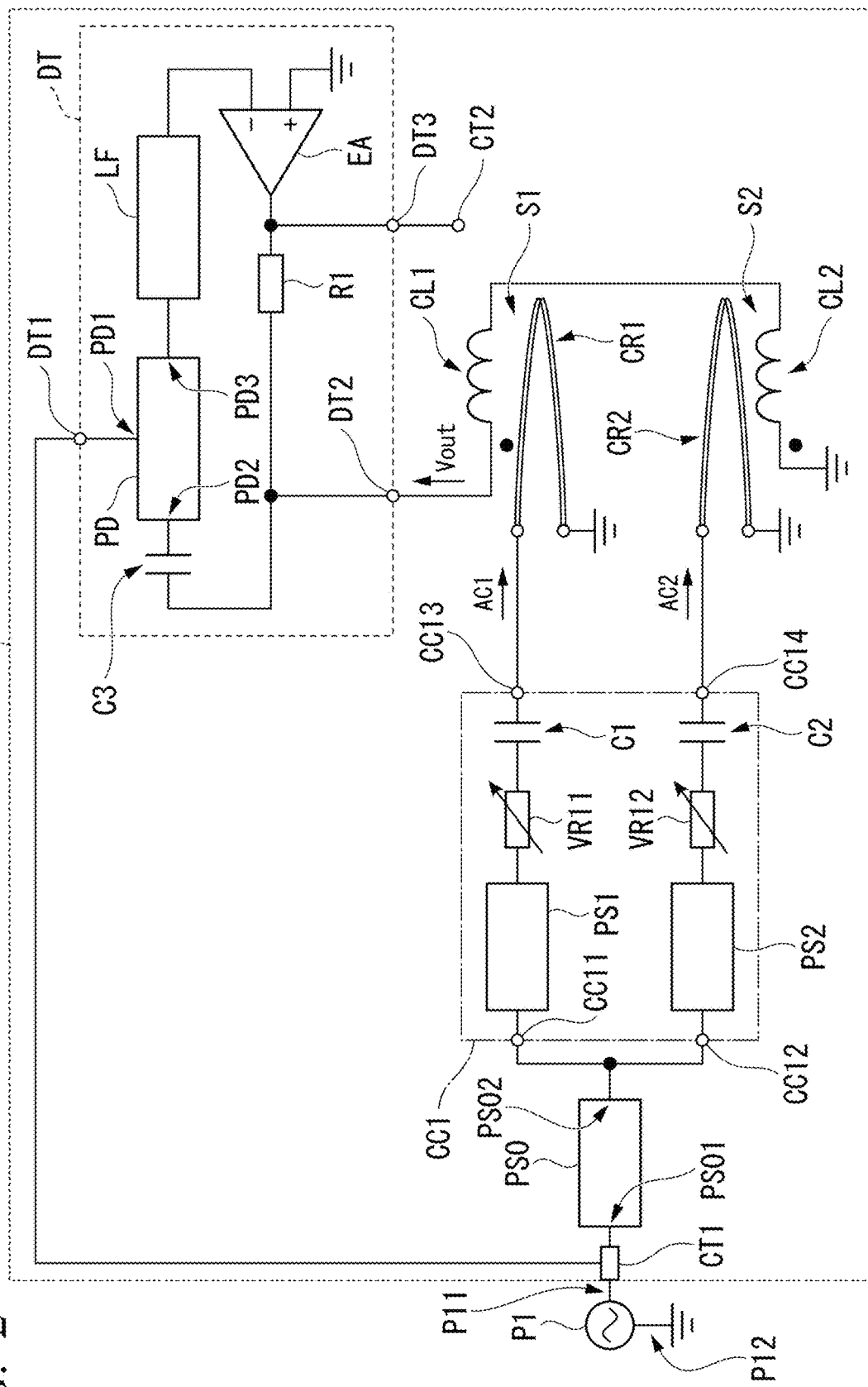
FIG. 2 is a diagram illustrating an example of a circuit configuration of a gradient magnetic field sensor 12.

Hereinafter, a circuit configuration of the gradient magnetic field sensor 12 will be described with reference to FIG. 2. FIG. 2 is a diagram illustrating an example of the circuit configuration of the gradient magnetic field sensor 12.

The gradient magnetic field sensor 12 includes an AC power supply connection terminal CT1, a first sensor head S1, a second sensor head S2, a 0th phase shift circuit PS0, an AC current control unit CC1, a detection circuit DT, and a detection signal output terminal CT2. The first sensor head S1 includes a first magnetic core CR1 and a first detection coil CL1. In addition, the second sensor head S2 includes a second magnetic core CR2 and a second detection coil CL2. The 0th phase shift circuit PS0 includes two terminals including an input terminal PS01 and an output terminal PS02. The AC current control unit CC1 includes a first input terminal CC11, a second input terminal CC12, a first output terminal CC13, and a second output terminal CC14. In addition, the AC current control unit CC1 includes a first phase shift circuit PS1, a first variable resistor VR11, a first capacitor C1, a second phase shift circuit PS2, a second variable resistor VR12, and a second capacitor C2. The detection circuit DT includes a first input terminal DT1, a second input terminal DT2, and an output terminal DT3. In addition, the detection circuit DT includes a phase detecting circuit PD, a low pass filter LF, an error amplifier EA, a resistor R1, and a third capacitor C3. The phase detecting circuit PD includes a first input terminal PD1, a second input terminal PD2, and an output terminal PD3.

In addition, the gradient magnetic field sensor 12 is connected to an AC power supply P1 through a transmission line. More specifically, the AC power supply connection terminal CT1 of the gradient magnetic field sensor 12 is connected to a first power supply terminal P11, which is one of two power supply terminals included in the AC power supply P1, through a transmission line. A second power supply terminal P12, which is the other of the two power supply terminals included in the AC power supply P1, is grounded through a transmission line. Here, the AC power supply P1 may be any AC power supply. In addition, between the AC power supply connection terminal CT1 and the first power supply terminal P11, in a range in which a function of the gradient magnetic field sensor 12 is not damaged, another circuit element, another device, and the like may be configured to be connected. Furthermore, between the second power supply terminal P12 and the ground, in a range in which the function of the gradient magnetic field sensor 12 is not damaged, another circuit element, another device, and the like may be configured to be connected.

In addition, the gradient magnetic field sensor 12 is connected to the information processing device 20 through a transmission line. More specifically, the detection signal output terminal CT2 of the gradient magnetic field sensor 12 is connected to the information processing device 20 through a transmission line. In addition, between the detection signal output terminal CT2 and the information processing device 20, in a range in which the function of the gradient magnetic field sensor 12 is not damaged, another circuit element, another device, and the like may be configured to be connected.

In addition, the AC power supply connection terminal CT1 is connected to each of an input terminal PS01 included in the 0th phase shift circuit PS0 and a first input terminal DT1 included in the detection circuit DT through a transmission line. An output terminal PS02 included in the 0th phase shift circuit PS0 is connected to each of a first input terminal CC11 included in the AC current control unit CC1 and a second input terminal CC12 included in the AC current control unit CC1 through a transmission line. In addition, between the AC power supply connection terminal CT1 and the input terminal PS01, in a range in which the function of the gradient magnetic field sensor 12 is not damaged, another circuit element, another device, and the like may be configured to be connected. Furthermore, between the AC power supply connection terminal CT1 and the first input terminal DT1, in a range in which the function of the gradient magnetic field sensor 12 is not damaged, another circuit element, another device, and the like may be configured to be connected. In addition, between the output terminal PS02 and the first input terminal CC11, in a range in which the function of the gradient magnetic field sensor 12 is not damaged, another circuit element, another device, and the like may be configured to be connected. Furthermore, between the output terminal PS02 and the second input terminal CC12, in a range in which the function of the gradient magnetic field sensor 12 is not damaged, another circuit element, another device, and the like may be configured to be connected.

In the AC current control unit CC1, between the first input terminal CC11 and the first output terminal CC13, the first phase shift circuit PS1, the first variable resistor VR11, and a first capacitor C1 are connected in series through a transmission line. In addition, in the AC current control unit CC1, between the second input terminal CC12 and the second output terminal CC14, the second phase shift circuit PS2, the second variable resistor VR12, and a second capacitor C2 are connected in series through a transmission line. Between the first input terminal CC11 and the first output terminal CC13, in a range in which the function of the gradient magnetic field sensor 12 is not damaged, another circuit element, another device, and the like may be configured to be connected together with the first phase shift circuit PS1, the first variable resistor VR11, and the first capacitor C1. In addition, between the first input terminal CC11 and the first output terminal CC13, the first phase shift circuit PS1, the first variable resistor VR11, and the first capacitor C1 may be configured to be connected in series in any order Between the second input terminal CC12 and the second output terminal CC14, in a range in which the function of the gradient magnetic field sensor 12 is not damaged, another circuit element, another device, and the like may be configured to be connected together with the second phase shift circuit PS2, the second variable resistor VR12, and the second capacitor C2. In addition, between the second input terminal CC12 and the second output terminal CC14, the second phase shift circuit PS2, the second variable resistor VR12, and the second capacitor C2 may be configured to be connected in series in any order.

Between the first output terminal CC13 included in the AC current control unit CC1 and the ground, the first magnetic core CR1 of the first sensor head S1 is connected through a transmission line. In addition, between the second output terminal CC14 of the AC current control unit CC1 and the ground, the second magnetic core CR2 of the second sensor head S2 is connected through a transmission line. Hereinafter, for the convenience of description, an AC current flowing from the first output terminal CC13 to the first magnetic core CR1, as denoted by an arrow illustrated in FIG. 2, will be referred to as a first AC excitation current AC1 in description. In addition, hereinafter, for the convenience of description, an AC current flowing from the second output terminal CC14 to the second magnetic core CR2, as denoted by an arrow illustrated in FIG. 2, will be referred to as a second AC excitation current AC2 in description. Between the first output terminal CC13 included in the AC current control unit CC1 and the ground, in a range in which the function of the gradient magnetic field sensor 12 is not damaged, another circuit element, another device, and the like may be configured to be connected together with the first magnetic core CR1. In addition, between the second output terminal CC14 included in the AC current control unit CC1 and the ground, in a range in which the function of the gradient magnetic field sensor 12 is not damaged, another circuit element, another device, and the like may be configured to be connected together with the second magnetic core CR2.

In addition, in the detection circuit DT, the first input terminal DT1 is connected to the first input terminal PD1 included in the phase detecting circuit PD through a transmission line. The output terminal PD3 included in the phase detecting circuit PD is connected to an input terminal, which is not illustrated, included in the low pass filter LF through a transmission line. In addition, an output terminal, which is not illustrated, included in the low pass filter LF is connected to an inverted input terminal included in the error amplifier EA through a transmission line. In addition, a non-inverted input terminal included in the error amplifier EA is grounded through a transmission line. An output terminal included in the error amplifier EA is connected to the output terminal DT3 included in the detection circuit DT and one of two terminals included in the resistor R1 through transmission lines. The other of the two terminals included in the resistor R1 is connected to the second input terminal DT2 included in the phase detecting circuit PD and one of two terminals included in the third capacitor C3 through transmission lines. The other of the two terminals included in the third capacitor C3 is connected to the second input terminal PD2 included in the phase detecting circuit PD through a transmission line. In addition, the transmission line connecting the resistor R1 and the third capacitor C3 is connected to the second input terminal DT2 included in the detection circuit DT through another transmission line. In this way, the detection circuit DT is a PSD (Phase Sensitive Detector) circuit. In addition, between the first input terminal DT1 and the first input terminal PD1, in a range in which the function of the detection circuit DT is not damaged, another circuit element, another device, and the like may be configured to be connected. Furthermore, between the output terminal PD3 and an input terminal included in the low pass filter LF, in a range in which the function of the detection circuit DT is not damaged, another circuit element, another device, and the like may be configured to be connected. In addition, between the output terminal included in the low pass filter LF and the inverted input terminal included in the error amplifier EA, in a range in which the function of the detection circuit DT is not damaged, another circuit element, another device, and the like may be configured to be connected. Furthermore, between the non-inverted input terminal included in the error amplifier EA and the ground, in a range in which the function of the detection circuit DT is not damaged, another circuit element, another device, and the like may be configured to be connected. In addition, between the output terminal included in the error amplifier EA and the output terminal DT3, in a range in which the function of the detection circuit DT is not damaged, another circuit element, another device, and the like may be configured to be connected. Furthermore, between the output terminal included in the error amplifier EA and the resistor R1, in a range in which the function of the detection circuit DT is not damaged, another circuit element, another device, and the like may be configured to be connected. In addition, between the resistor R1 and the third capacitor C3, in a range in which the function of the detection circuit DT is not damaged, another circuit element, another device, and the like may be configured to be connected. Furthermore, between the third capacitor C3 and the second input terminal PD2, in a range in which the function of the detection circuit DT is not damaged, another circuit element, another device, and the like may be configured to be connected. In addition, between the transmission line connecting the resistor R1 and the third capacitor C3 and the second input terminal DT2, in a range in which the function of the detection circuit DT is not damaged, another circuit element, another device, and the like may be configured to be connected.

The second input terminal DT2 included in the detection circuit DT is connected to one of two terminals included in the first detection coil CL1 through a transmission line. In addition, the other of the two terminals included in the first detection coil CL1 is connected to one of two terminals included in the second detection coil CL2 through a transmission line. The other of the two terminals included in the second detection coil CL2 is grounded through a transmission line. Here, the second detection coil CL2 is differentially-connected together with the first detection coil CL1. In addition, between the second input terminal DT2 and the first detection coil CL1, in a range in which the function of the gradient magnetic field sensor 12 is not damaged, another circuit element, another device, and the like may be configured to be connected. Furthermore, between the first detection coil CL1 and the second detection coil CL2, in a range in which the function of the gradient magnetic field sensor 12 is not damaged, another circuit element, another device, and the like may be configured to be connected. In addition, between the second detection coil CL2 and the ground, in a range in which the function of the gradient magnetic field sensor 12 is not damaged, another circuit element, another device, and the like may be configured to be connected.

<Operation of Gradient Magnetic Field Sensor According to Embodiment>

Next, an operation of the gradient magnetic field sensor 12 will be described.

In the gradient magnetic field sensor 12 having the circuit configuration described above, the AC power supply P1 inputs an AC current to the AC power supply connection terminal CT1. The AC current input to the AC power supply connection terminal CT1 branches into two AC currents. One of the two AC currents acquired through branching is input to the 0th phase shift circuit PS0 as an AC excitation current. In addition, the other of the two AC currents acquired through branching is input to the first input terminal DT1 included in the detection circuit DT as a reference signal.

An AC excitation current input to the 0th phase shift circuit PS0, after a phase thereof is shifted by the 0th phase shift circuit PS0, branches into two AC excitation currents including a first AC excitation current AC1 and a second AC excitation current AC2.

The first AC excitation current AC1 flows through the first magnetic core CR1 through the first phase shift circuit PS1, the first variable resistor VR11, and the first capacitor C1. For this reason, the first AC excitation current AC1 has a phase shifted by the first phase shift circuit PS1 and has an amplitude adjusted by the first variable resistor VR11. In accordance with this, a voltage corresponding to the first AC excitation current AC1 flowing through the first magnetic core CR1 and an intensity of a magnetic field applied to the first detection coil CL1 is induced in the first detection coil CL1. In other words, this voltage changes in accordance with an intensity of a magnetic field applied to the first detection coil CL1 from the outside. Hereinafter, for the convenience of description, a voltage induced in the first detection coil CL1 will be referred to as a first induction voltage in description. The first capacitor C1 is a capacitor that is used for AC(Alternating Current) coupling. In accordance with presence of the first capacitor C1, in the gradient magnetic field sensor 12, a DC current can be inhibited from flowing from the first output terminal CC13 to the first input terminal CC11.

On the other hand, the second AC excitation current AC2 flows through the second magnetic core CR2 through the second phase shift circuit PS2, the second variable resistor VR12, and the second capacitor C2. For this reason, the second AC excitation current AC2 has a phase shifted by the second phase shift circuit PS2 and has an amplitude adjusted by the second variable resistor VR12. In accordance with this, a voltage corresponding to the second AC excitation current AC2 flowing through the second magnetic core CR2 and an intensity of a magnetic field applied to the second detection coil CL2 is induced in the second detection coil CL2. In other words, this voltage changes in accordance with an intensity of a magnetic field applied to the second detection coil CL2 from the outside. Hereinafter, for the convenience of description, a voltage induced in the second detection coil CL2 will be referred to as a second induction voltage in description. The second capacitor C2 is a capacitor that is used for AC coupling. In accordance with presence of the second capacitor C2, in the gradient magnetic field sensor 12, a DC current can be inhibited from flowing from the second output terminal CC14 to the second input terminal CC12.

In the gradient magnetic field sensor 12, a signal corresponding to the first induction voltage and the second induction voltage induced in this way is input to the second input terminal DT2 included in the detection circuit DT as a differential signal Vout. The phase detecting circuit PD of the detection circuit DT inputs a signal corresponding to a difference between the differential signal Vout input in this way and a reference signal input from the AC power supply P1 to the low pass filter LF as a wave detection signal. The low pass filter LF outputs an output signal acquired by eliminating components of a predetermined first frequency or a higher frequency from the wave detection signal input from the phase detecting circuit PD to the inverted input terminal of the error amplifier EA. The error amplifier EA outputs a signal corresponding to an electric potential difference between an electric potential of an output signal input to the inverted input terminal of the error amplifier EA and a ground electric potential to each of the detection signal output terminal CT2 and the resistor R1 as a detection signal. The third capacitor C3 is a capacitor that is used for AC coupling. In addition, a buffer circuit (for example, a voltage follower or the like) is connected to a terminal among terminals included in the third capacitor C3 that is on a side opposite to a terminal to which the phase detecting circuit PD is connected. For simplification of the drawing, illustration of this buffer circuit is omitted.

The detection signal input to the resistor R1 flows from the second input terminal DT2 to the first detection coil CL1 as a feedback current without being input to the third capacitor C3 in accordance with presence of a buffer circuit not illustrated in the drawing.

By performing adjustment for the detection circuit DT performing such an operation, in a case in which a signal level of the differential signal Vout is 0 [V], a detection signal of which a signal level is 0 [V] can be output from the detection signal output terminal CT2, and, in a case in which a signal level of the differential signal Vout is not 0 [V], a detection signal of which a signal level is not 0 [V] can be output from the detection signal output terminal CT2. The adjustment of the detection circuit DT is known, and thus further detailed description thereof will be omitted.

By using the operation described above, the gradient magnetic field sensor 12 detects a gradient. However, in a case in which adjustment of the first induction voltage and the second induction voltage is not performed, the gradient magnetic field sensor 12 may detect a gradient also inside a uniform magnetic field area. This leads to erroneous detection indicating presence of a detection target object regardless of the detection target object being absent, which is not desirable. Thus, by adjusting the gradient magnetic field sensor 12 using a predetermined adjustment method to be described below, accuracy of detection of a detection target object using a magnetic field can be improved. Thus, hereinafter, a method of adjusting the first induction voltage and the second induction voltage in the gradient magnetic field sensor 12 will be described.

<Method of Adjusting First Induction Voltage and Second Induction Voltage in Gradient Magnetic Field Sensor>

Hereinafter, a method of adjusting a first induction voltage and a second induction voltage in the gradient magnetic field sensor 12 will be described.

First, a relation between an intensity of a magnetic field detected using the gradient magnetic field sensor 12 and a detection signal output from the gradient magnetic field sensor 12 will be described.

A case in which an intensity $B_1(t)$ of a magnetic field applied to the first sensor head S1 at a certain time t is represented by the following Equation (1), and an intensity $B_2(t)$ of a magnetic field applied to the second sensor head S2 at the certain time t is represented by the following Equation (2) will be considered. Here, as an example, a case in which a uniform magnetic field is applied to the gradient magnetic field sensor 12, and a magnetized detection target object is conveyed to the inside of a detection area of the gradient magnetic field sensor 12 is considered. Hereinafter, for the convenience of description, a magnetic field applied from a detection target object to the first sensor head S1 will be referred to as a first magnetic field in description. In addition, hereinafter, for the convenience of description, a magnetic field applied from a detection target object to the second sensor head S2 will be referred to as a second magnetic field in description.

[Math. 1]
$$B_1(t)=B_{01}(t)+B\cos(\omega_n t) \quad (1)$$

[Math. 2]
$$B_2(t)=B_{02}(t)+B\cos(\omega_n t) \quad (2)$$

Here, $B_{01}(t)$ represented above in Equation (1) is a function that represents an intensity of the first magnetic field at a time t. In addition, $B_{02}(t)$ represented above in Equation (2) is a function that represents an intensity of the second magnetic field at a time t. In addition, $B\cos(\omega_n t)$ represented in Equation (1) and Equation (2) is a function that represents an intensity of a uniform magnetic field at a time t. Here, $\omega_n$ represents an angular frequency of a change of the intensity of the uniform magnetic field over time. In addition, B represents a maximum intensity of the uniform magnetic field.

In addition, a case in which a magnitude of a reference signal at a time t is denoted by $V_r(t)$ represented in the following Equation (3) will be considered. Here, A in the following Equation (3) represents an amplitude of a reference signal. In addition, $\omega$ in the following Equation (3) represents an angular frequency of a reference signal that is an AC signal.

[Math. 3]
$$V_r(t)=A\cos(\omega t) \quad (3)$$

In addition, a case in which a magnitude of a differential signal Vout at a time t is denoted by $V_i(t)$ represented in the following Equation (4) will be considered.

[Math. 4]
$$V_i(t)=a\{1+k_1B_1(t)\}\cos(\omega t+\theta+\alpha)+b\{1+k_2B_2(t)\}\cos(\omega t+\theta+\beta) \quad (4)$$

Here, $\theta$ represented above in Equation (4) represents an amount of phase shift of an AC excitation current according to the 0th phase shift circuit PS0. In addition, $\alpha$ represented in Equation (4) represents an amount of phase shift of the first AC excitation current AC1 according to the first phase shift circuit PS1. Furthermore, $\beta$ represented in Equation (4) represents an amount of phase shift of the second AC excitation current AC2 according to the second phase shift circuit PS2. In addition, a in Equation (4) represents an amount of adjustment of an amplitude of the first AC excitation current AC1 according to the first variable resistor VR11. Furthermore, b in Equation (4) represents an amount of adjustment of an amplitude of the second AC excitation current AC2 according to the second variable resistor VR12. In addition, a differential signal Vout is acquired using a difference between a first induction voltage induced as a result of AM modulation of the first magnetic field and a second induction voltage induced as a result of AM modulation of the second magnetic field. Modulation indexes (that is, magnetic sensitivities) of such AM modulation are $k_1$ and $k_2$ represented in Equation (4). In addition, $k_1$ is a modulation index of AM modulation of the first magnetic field. Furthermore, $k_2$ is a modulation index of AM modulation of the second magnetic field.

The phase detecting circuit PD outputs a signal as represented in the following Equation (5) as a magnitude $V_0(t)$ of a wave detection signal at a time t based on a magnitude $V_r(t)$ of the reference signal represented using Equation (3) described above and a magnitude $V_t(t)$ of the differential signal Vout represented using Equation (4) described above.

[Math. 5]

$$V_0(t)=V_r(t)\cdot V_t(t)=A\cos(\omega t)\cdot a\{1+k_1B_1(t)\}\cos(\omega t+\theta+\alpha)+A\cos(\omega t)\cdot b\{1+k_2B_2(t)\}\cos(\omega t+\theta+\beta) \quad (5)$$

A right side of the lowest stage of Equation (5) described above can be transformed into the following Equation (6) using the addition theorem.

[Math. 6]

$$V_0(t) = \frac{A}{2}a\{1+k_1B_1(t)\}\{\cos(\theta+\alpha)+\cos(2\omega t+\theta+\alpha)\} + \frac{A}{2}b\{1+k_2B_2(t)\}\{\cos(\theta+\beta)+\cos(2\omega t+\theta+\beta)\} \quad (6)$$

$\cos(\theta+\alpha)$ and $\cos(\theta+\beta)$ of the right side of Equation (6) represented above are terms not changing over time t, in other words, DC components. These DC components can be eliminated using a low pass filter LF. Thus, an equation acquired by eliminating the DC components from Equation (6) is the following Equation (7).

[Math. 7]

$$V_0(t) = \frac{A}{2}a\{1+k_1B_1(t)\}\cos(2\omega t+\theta+\alpha) + \frac{A}{2}b\{1+k_2B_2(t)\}\cos(2\omega t+\theta+\beta) \quad (7)$$

Here, in Equation (7) represented above, it is requested that a difference ($\alpha-\beta$) between a sum ($\theta+\alpha$) of an amount of phase shift $\theta$ according to the 0th phase shift circuit PS0 and an amount of phase shift $\alpha$ according to the first phase shift circuit PS1 and a sum ($\theta+\beta$) of the amount of phase shift $\theta$ according to the 0th phase shift circuit PS0 and an amount of phase shift $\beta$ according to the second phase shift circuit PS2 be $-\pi$. This request is a request for causing the phase of the first induction voltage and the phase of the second induction voltage to be opposite phases. This request can be realized by adjusting at least one of the amount of phase shift $\alpha$ of the first phase shift circuit PS1 and the amount of phase shift $\beta$ of the second phase shift circuit PS2. In Equation (7) represented above, it is requested that a product of an amount of adjustment a according to the first variable resistor VR11 and a modulation index $k_1$ and a product of an amount of adjustment b according to the second variable resistor VR12 and a modulation index $k_2$ be the same (in other words, $ak_1=bk_2$). This request is a request for causing the amplitude of the first induction voltage and the amplitude of the second induction voltage to be the same. This request can be realized by adjusting at least one of the amount of adjustment a of the first variable resistor VR11 and the amount of adjustment b of the second variable resistor VR12 (in addition, in order to perform this adjustment, values of the modulation index $k_1$ and the modulation index $k_2$ do not need to be known). By applying these two requests to Equation (7), Equation (7) is transformed into Equation (8).

[Math. 8]

$$V_0(t) = \frac{A}{2}a\cos(\theta+\alpha)\left[k_1\{B_1(t)-B_2(t)\}+\left(1-\frac{k_1}{k_2}\right)\right] \quad (8)$$

From Equation (8) represented above, it can be understood that, by performing the two adjustments described above, a component $B\cos(\omega_n t)$ of a uniform magnetic field can be cancelled from the magnitude $V_0(t)$ of a detection signal. Hereinafter, for the convenience of description, these two adjustments will be referred to as an AC current adjustment in description. In other words, by performing the AC current adjustment, the gradient magnetic field sensor 12 can detect a gradient without detecting an intensity of a uniform magnetic field. As a result, the gradient magnetic field sensor 12 can improved accuracy of detection of a detection target object using a magnetic field. A second term within a bracket of a right side of Equation (8) represented above is an offset component. This offset component is included in a detection signal as an error. In order to acquire a magnitude of this offset component, it is necessary to acquire values of the modulation index $k_1$ and the modulation index $k_2$ or a ratio between the modulation index $k_1$ and the modulation index $k_2$. However, this offset component can be eliminated by signal processing as described below. In a case in which the offset component is eliminated by the signal processing, it is not necessary to acquire values of the modulation index $k_1$ and the modulation index $k_2$ or a ratio between the modulation index $k_1$ and the modulation index $k_2$. Generally, this offset component is smaller than a first term within a bracket of a right side of Equation (8) represented above. For this reason, in the embodiment, a case in which this offset component is not eliminated but handled as an error will be described.

Figure 3:
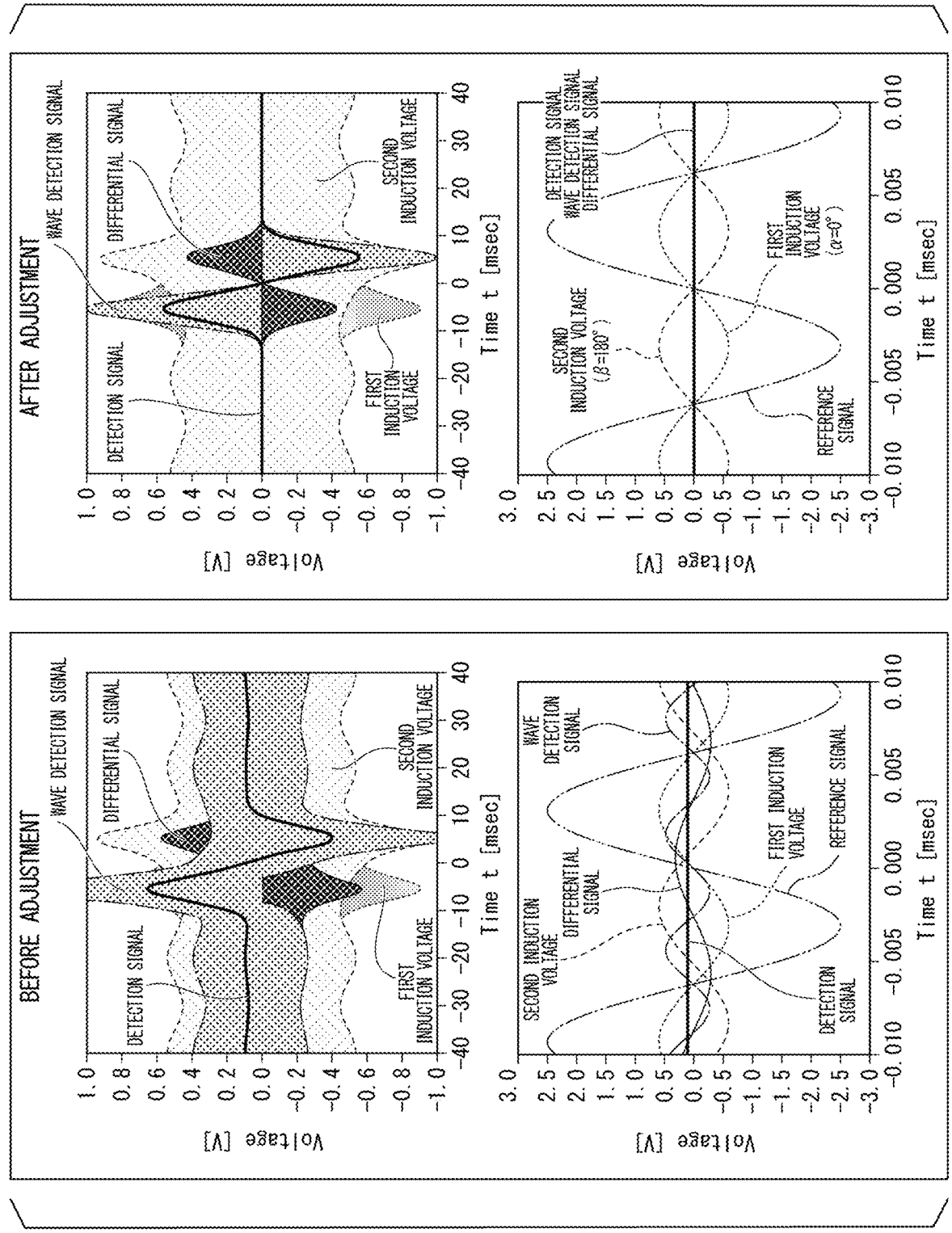
FIG. 3 is a diagram illustrating an example of changes in a first induction voltage, a second induction voltage, a differential signal, a wave detection signal, and a detection signal over time before and after performing AC current adjustment on the gradient magnetic field sensor 12.

Here, FIG. 3 is a diagram illustrating an example of changes of a first induction voltage, a second induction voltage, a differential signal, a wave detection signal, and a detection signal over time before/after AC current adjustment is performed on the gradient magnetic field sensor 12.

Two graphs on a left side enclosed by a label "Before adjustment" among four graphs illustrated in FIG. 3 are diagrams illustrating changes of a first induction voltage, a second induction voltage, a differential signal, a wave detection signal, and a detection signal over time in the gradient magnetic field sensor 12 before AC current adjustment is performed. In addition, two graphs on a right side enclosed by a label "After adjustment" among the four graphs are diagrams illustrating changes of a first induction voltage, a second induction voltage, a differential signal, a wave detection signal, and a detection signal over time in the gradient magnetic field sensor 12 after AC current adjustment is performed. Upper two graphs among these four graphs are graphs of a case in which magnetic moment according to a coil of which the number of windings is one is detected inside a uniform magnetic field area in which the intensity changes in a sinusoidal wave of 50 Hz. In addition, lower two graphs among these four graphs are diagrams illustrating changes of a first induction voltage, a second induction voltage, a differential signal, a wave detection signal, and a detection signal over time in the gradient magnetic field sensor 12 disposed inside an area in which no magnetic field is applied. In these four graphs, the horizontal axis represents an elapsed time. In addition, in these four graphs, the vertical axis represents a voltage.

When the lower graphs of "Before adjustment" illustrated in FIG. 3 are referred to, phases of the first induction voltage and the second induction voltage are not opposite phases, and thus, although the gradient magnetic field sensor 12 is disposed inside an area in which no magnetic field is applied, a signal level of the differential signal is not 0 [V]. For this reason, in a lower graph of "Before adjustment" in FIG. 3, a signal level of a wave detection signal is not 0 [V], and as a result, a signal level of a detection signal is not 0 [V]. In this case, the gradient magnetic field sensor 12 cannot cause a component $B \cos(\omega_n t)$ of the uniform magnetic field to be canceled from the magnitude $V_0(t)$ of the detection signal in Equation (8) represented above, and thus when the gradient magnetic field sensor 12 is disposed inside the uniform magnetic field area, the uniform magnetic field is detected. From such a situation, in the gradient magnetic field sensor 12 before performance of AC current adjustment, as illustrated in the upper graphs of "Before adjustment" in FIG. 3, a detection signal acquired in a case in which the gradient magnetic field sensor 12 is disposed inside an area in which no magnetic field is applied is superimposed in a detection signal acquired in a case in which a magnetic moment is detected using a coil of which the number of windings is one inside the uniform magnetic field area. As a result, in the upper graphs of "Before adjustment" in FIG. 3, for example, a signal level of the detection signal is not 0 [V] within a range of −40 msec to −20 msec, within a range of 20 msec to 40 msec, and the like, and the signal level of the detection signal oscillates near 0.1 [V]. The oscillation of such a detection signal becomes an error in detection of a gradient using the gradient magnetic field sensor 12. For this reason, in the gradient magnetic field sensor 12 before performance of AC current adjustment, in a case in which a gradient to be detected is small, there is a possibility of the gradient being buried in an error according to such an oscillation and the detection signal not being seen.

On the other hand, when the lower groups of "After adjustment" in FIG. 3 are referred to, phases of the first induction voltage and the second induction voltage are opposite phases, and thus, in a case in which the gradient magnetic field sensor 12 is disposed inside an area in which no magnetic field is applied, the signal level of the differential signal becomes 0 [V]. For this reason, in the lower graphs of "After adjustment" illustrated in FIG. 3, the signal level of a wave detection signal is almost 0 [V] (actually, the signal level slightly oscillates due to a noise and the like and thus is not completely 0 [V]), and as a result, the signal level of the detection signal is almost 0 [V]. In this case, the gradient magnetic field sensor 12 can cause a component $B \cos(\omega_n t)$ of the uniform magnetic field to be cancelled from the magnitude $V_0(t)$ of the detection signal in Equation (8) represented above, and thus, even in a case in which the gradient magnetic field sensor is disposed inside a uniform magnetic field area, no uniform magnetic field is detected. From such a situation, in the gradient magnetic field sensor 12 after performance of AC current adjustment, as illustrated in the upper graphs of "After adjustment" in FIG. 3, a detection signal acquired in a case in which the gradient magnetic field sensor 12 is disposed inside an area in which no magnetic field is applied is not superimposed in a detection signal acquired in a case in which a magnetic moment is detected using a coil of which the number of windings is one inside the uniform magnetic field area. As a result, in the upper graphs of "After adjustment" in FIG. 3, for example, a signal level of the detection signal is almost 0 [V] within a range of −40 msec to −20 msec, within a range of 20 msec to 40 msec, and the like. As a result, in the gradient magnetic field sensor 12 after performance of AC current adjustment, even when a gradient to be detect is small, a detection signal representing a gradient is not buried in an error. In other words, the gradient magnetic field sensor 12 after performance of AC current adjustment can detect a gradient without detecting an intensity of the uniform magnetic field. In other words, the gradient magnetic field sensor 12 after performance of AC current adjustment can detect a detection target object with high accuracy.

Figure 4:
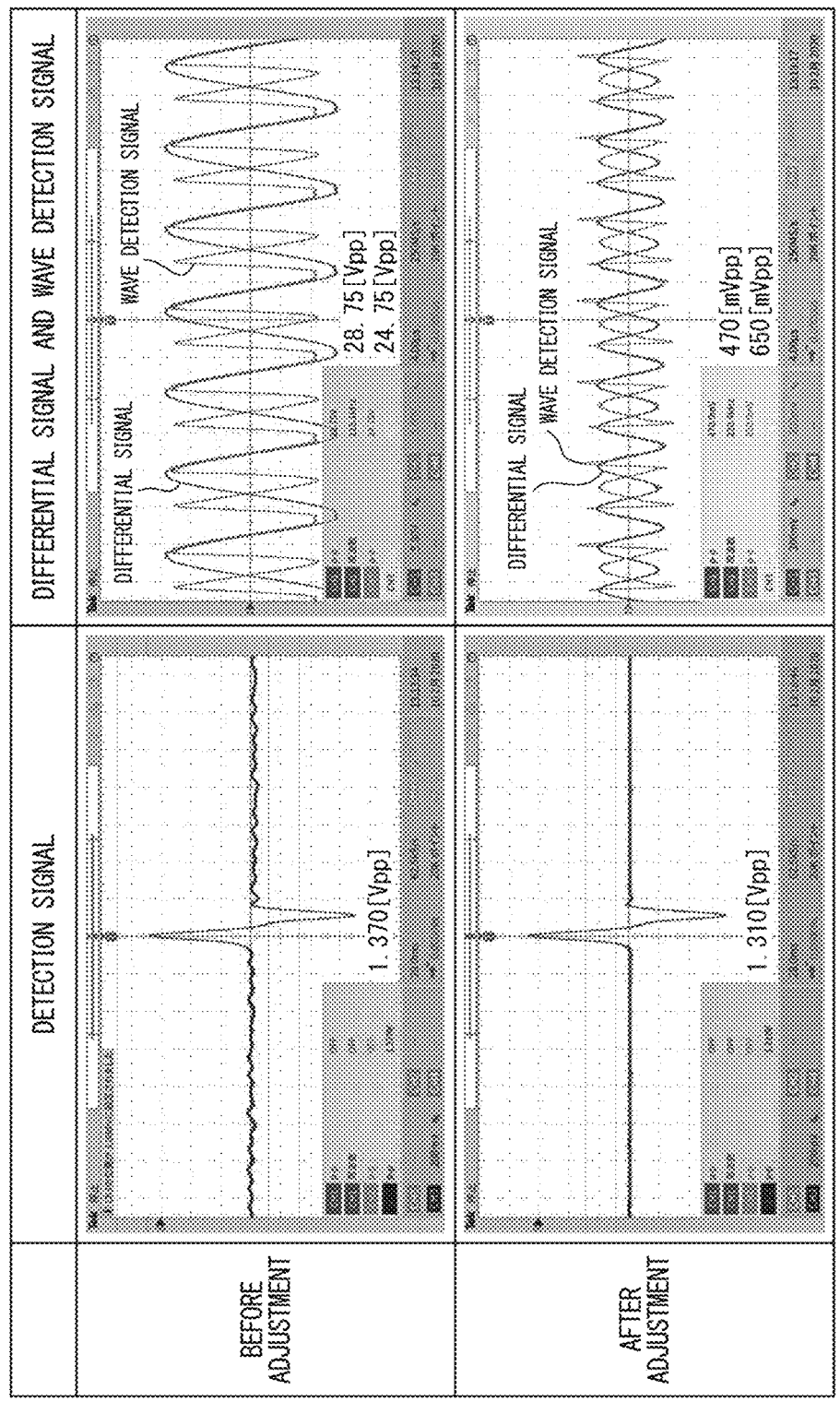
FIG. 4 is a diagram illustrating an example of changes in a detection signal, a differential signal and a wave detection signal over time in a case in which a magnetic moment according to a coil of which the number of windings is one is detected by a gradient magnetic field sensor 12 before/after performing AC current adjustment on the gradient magnetic field sensor 12.

FIG. 4 is a diagram illustrating an example of changes of a detection signal, a differential signal, and a wave detection signal over time before/after performance of AC current adjustment on the gradient magnetic field sensor 12 in a case in which a magnetic moment according to a coil of which the number of windings is one is detected by the gradient magnetic field sensor 12.

A right graph out of the two upper graphs enclosed by the label "Before adjustment" illustrated in FIG. 4 is a diagram illustrating changes of a differential signal and a wave detection signal over time in the gradient magnetic field sensor 12 before performance of AC current adjustment. In addition, this graph is a diagram illustrating changes of a differential signal and a wave detection signal over time acquired in a case in which the gradient magnetic field sensor 12 is disposed inside an area in which no magnetic field is applied. On the other hand, a right graph out of the two lower graphs enclosed by the label "After adjustment" illustrated in FIG. 4 is a diagram illustrating changes of a differential signal and a wave detection signal over time in the gradient magnetic field sensor 12 after performance of AC current adjustment. This graph is a diagram illustrating changes of a differential signal and a wave detection signal over time acquired in a case in which the gradient magnetic field sensor 12 is disposed inside an area in which no magnetic field is applied. When these two graphs are compared with each other, it can be understood that an amplitude of the differential signal after performance of AC current adjustment is smaller than that of the differential signal before performance of AC current adjustment by about two digits. As a result, an amplitude of the wave detection signal after performance of AC current adjustment is also smaller than that of the wave detection signal before performance of AC current adjustment by about two digits. From such a situation, in a case in which a scale resolution of a vertical axis of a right graph out of lower two graphs enclosed by the label of "Before adjustment" is transformed into the same scale resolution as the scale resolution of the vertical axis of the right graph out of the upper two graphs enclosed by the label of "Before adjustment", an oscillation of each of the differential signal and the wave detection signal after performance of AC current adjustment becomes not visible like an oscillation of each of the differential signal and the wave detection signal in the lower right graph illustrated in FIG. 3.

A left graph out of the two upper graphs enclosed by the label "Before adjustment" illustrated in FIG. 4 is a diagram illustrating changes of a detection signal over time in the gradient magnetic field sensor 12 before performance of AC current adjustment. In addition, this graph is a diagram illustrating changes of a detection signal over time that is acquired in a case in which a magnetic moment according to a coil of which the number of windings is one is detected inside a uniform magnetic field area. On the other hand, a left graph out of the two lower graphs enclosed by the label "After adjustment" illustrated in FIG. 4 is a diagram illustrating changes of a detection signal over time in the gradient magnetic field sensor 12 after performance of AC current adjustment. In addition, this graph is a diagram illustrating changes of a detection signal over time that is acquired in a case in which a magnetic moment according to a coil of which the number of windings is one is detected inside a uniform magnetic field area. When these two graphs are compared with each other, it can be understood that noise of a detection signal output from the gradient magnetic field sensor 12 decreases in accordance with AC current adjustment. The reason for this is that, as illustrated in a lower right graph illustrated in FIG. 4, amplitudes of the differential signal and the wave detection signal acquired in a case in which the gradient magnetic field sensor 12 is disposed inside an area in which no magnetic field is applied decrease in accordance with AC current adjustment, and as a result, the gradient magnetic field sensor 12 does not detect a uniform magnetic field.

Figure 5:
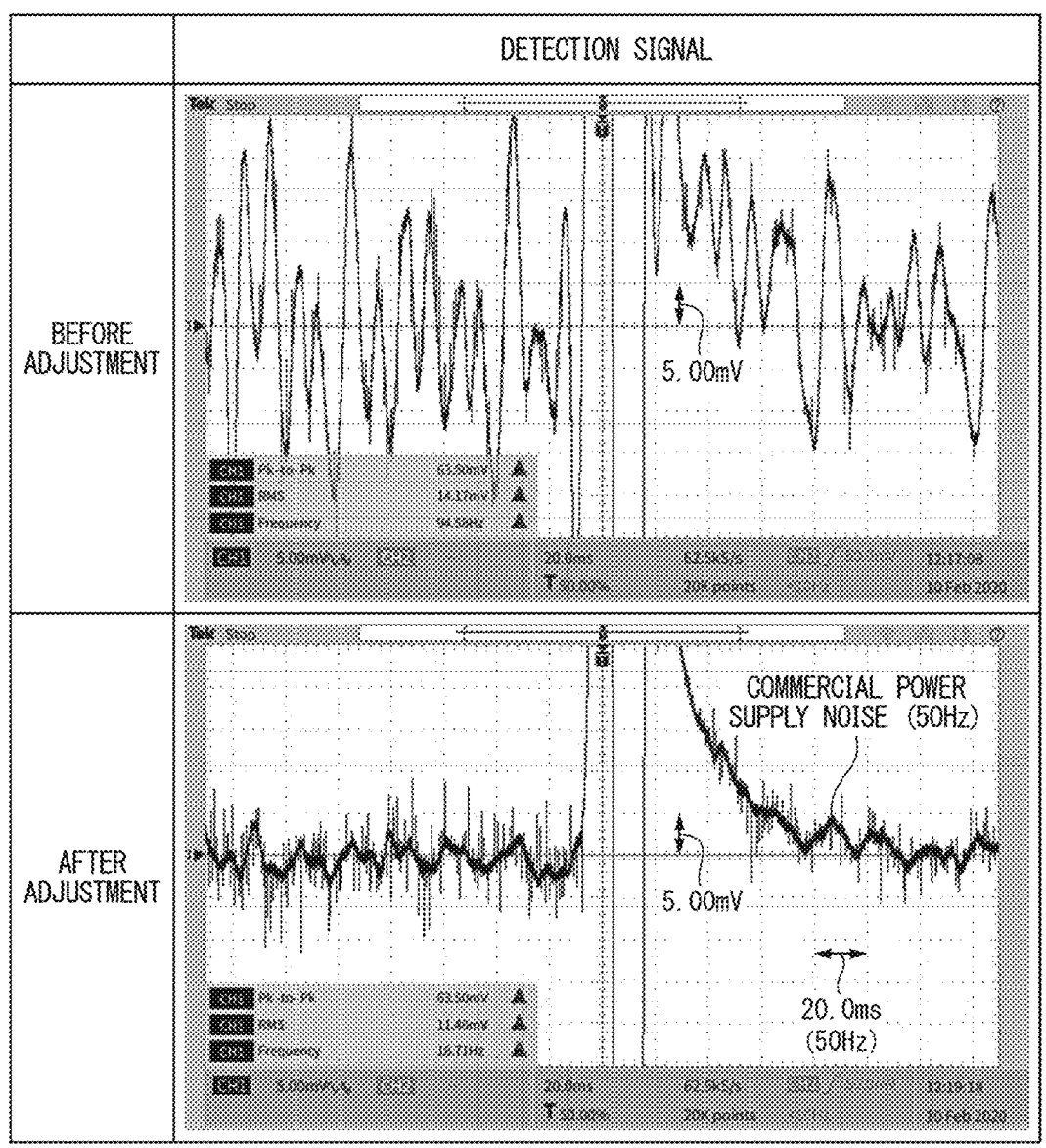
FIG. 5 is a diagram in which a part of each of two graphs for the detection signal illustrated in FIG. 4 is enlarged.

Here, FIG. 5 is a diagram acquired by enlarging a part of each of the two graphs for the detection signals illustrated in FIG. 4. An upper graph enclosed by a label "Before adjustment" illustrated in FIG. 5 is a diagram illustrating changes of a detection signal over time in the gradient magnetic field sensor 12 before performance of AC current adjustment. On the other hand, a lower graph enclosed by a label "After adjustment" illustrated in FIG. 5 is a diagram illustrating changes of a detection signal over time in the gradient magnetic field sensor 12 after performance of AC current adjustment. When these two graphs are compared with each other, it can be understood more clearly in comparison with the graphs illustrated in FIG. 4 that noise of the detection signal output from the gradient magnetic field sensor 12 decreases in accordance with the AC current adjustment.

In this way, it can be understood from the graphs illustrated in FIGS. 3 to 5 that, by performing AC current adjustment, the gradient magnetic field sensor 12 can detect a gradient without detecting an intensity of the uniform magnetic field, and, as a result, accuracy of detection of a detection target object using a magnetic field can be improved. An example of a circuit configuration realizing this is a circuit configuration illustrated in FIG. 2.

In addition, the gradient magnetic field sensor 12 according to an embodiment may be configured not to include the 0th phase shift circuit PS0. The reason for this is that, as described above, the amount of phase shift θ of the 0th phase shift circuit PS0 may have any value in the two requests described above. However, by including the 0th phase shift circuit PS0 in this gradient magnetic field sensor 12, the gradient magnetic field sensor 12 can adjust the amplitude of the detection signal with the relation $\alpha-\beta=-\pi$ being maintained using the amount of phase shift α according to the first phase shift circuit PS1 and the amount of phase shift β according to the second phase shift circuit PS2.

In addition, the gradient magnetic field sensor 12 according to an embodiment may be configured not to include any one of the first phase shift circuit PS1 and the second phase shift circuit PS2. The reason for this is that it is important for the difference between the amount of phase shift α of the first phase shift circuit PS1 and the amount of phase shift β of the second phase shift circuit PS2 to be $-\pi$ in the two requests described above. This is apparent also from that no inclusion of one of the first phase shift circuit PS1 and the second phase shift circuit PS2 in the gradient magnetic field sensor 12 corresponds to a case in which one of the amount of phase shift α and the amount of phase shift β is set to 0.

In addition, the gradient magnetic field sensor 12 according to an embodiment may be configured not to include any one of the first variable resistor VR11 and the second variable resistor VR12. The reason for this is that it is important for a product of the amount of adjustment a of the first variable resistor VR11 and the modulation index $k_1$ and a product of the amount of adjustment b of the second variable resistor VR12 and the modulation index $k_2$ being the same in the two requests described above. This is apparent also from that no inclusion of one of the first variable resistor VR11 and the second variable resistor VR12 in the gradient magnetic field sensor 12 corresponds to a case in which one of the amount of adjustment a and the amount of adjustment b is set to 1.

In addition, the gradient magnetic field sensor 12 according to an embodiment may be configured not to include at least one of the first capacitor C1 and the second capacitor C2. However, as described above, these are capacitors used for AC coupling. For this reason, it is preferable that the gradient magnetic field sensor 12 include both the first capacitor C1 and the second capacitor C2.

In addition, in the gradient magnetic field sensor 12 according to an embodiment, the AC current control unit CC1 may be configured to include a first amplification circuit amplifying the amplitude of the first AC excitation current AC1 in place of the first variable resistor VR11 or in addition to the first variable resistor VR11.

Furthermore, in the gradient magnetic field sensor 12 according to an embodiment, the AC current control unit CC1 may be configured to include a second amplification circuit amplifying the amplitude of the second AC excitation current AC2 in place of the second variable resistor VR12 or in addition to the second variable resistor VR12.

As above, the gradient magnetic field sensor 12 according to an embodiment includes: the AC power supply connection terminal CT1 to which the first power supply terminal P11 included in the AC power supply P1 is connected; the first magnetic core CR1 connected between the AC power supply connection terminal CT1 and the ground; the second magnetic core CR2 that is connected in parallel with the first magnetic core CR1 between the AC power supply connection terminal CT1 and the ground; the AC current control unit CC1 that is connected between the AC power supply connection terminal CT1 and at least one of the first magnetic core CR1 and the second magnetic core CR2 and configured to controls an AC current flowing through at least one of the first magnetic core CR1 and the second magnetic core CR2; the first detection coil CL1 wound around the first magnetic core CR1; the second detection coil CL2 that is wound around the second magnetic core CR2 and is differentially-connected with the first detection coil CL1; and the detection circuit DT detects a voltage corresponding to a difference between a first induction voltage output from the first detection coil CL1 and a second induction voltage output from the second detection coil CL2 as a detection signal. In accordance with this, the gradient magnetic field sensor 12 can improve detection accuracy for a detection target object using a magnetic field.

In addition, in the gradient magnetic field sensor 12, a configuration including an AC power supply P1 in which a second power supply terminal P12 included in the AC power supply P1 is grounded may be used.

Furthermore, in the gradient magnetic field sensor 12, the AC current control unit CC1 may be configured to include a phase shift unit that shifts a phase of at least one of a first AC excitation current AC1 flowing from the AC power supply connection terminal CT1 to the first magnetic core CR1 and a second AC excitation current AC2 flowing from the AC power supply connection terminal CT1 to the second magnetic core CR2. Each of the first phase shift circuit PS1 and the second phase shift circuit PS2 described above is an example of this phase unit.

In addition, in the gradient magnetic field sensor 12, the AC current control unit CC1 may be configured to include an amplitude adjusting unit that adjusts an amplitude of at least one of the first AC excitation current AC1 and the second AC excitation current AC2. Each of the first variable resistor VR11 and the second variable resistor VR12 described above is an example of this amplitude adjusting unit.

In addition, in the gradient magnetic field sensor 12, the AC current control unit CC1 may be configured to include at least one of a first amplification circuit and an 11th variable resistor connected between the AC power supply connection terminal CT1 and the first magnetic core CR1 and at least one of a second amplification circuit and a 12th variable resistor connected between the AC power supply connection terminal CT1 and the second magnetic core CR2 as amplitude adjusting units. The first variable resistor VR11 described above is an example of this 11th variable resistor. In addition, the second variable resistor VR12 described above is an example of this 12th variable resistor.

Modified Example 1 of Embodiment

Hereinafter, Modified example 1 of the embodiment will be described with reference to FIG. 6. In Modified example 1 of the embodiment, the same reference signs will be assigned to components similar to those according to the embodiment, and description thereof will be omitted. Hereinafter, for the convenience of description, a gradient magnetic field sensor 12 according to Modified example 1 of the embodiment will be referred to as a gradient magnetic field sensor 12A in description. In addition, matters described in Modified example 1 of the embodiment may be applied not only to embodiments but also any one of other modified examples of the embodiment to be described below.

Figure 6:
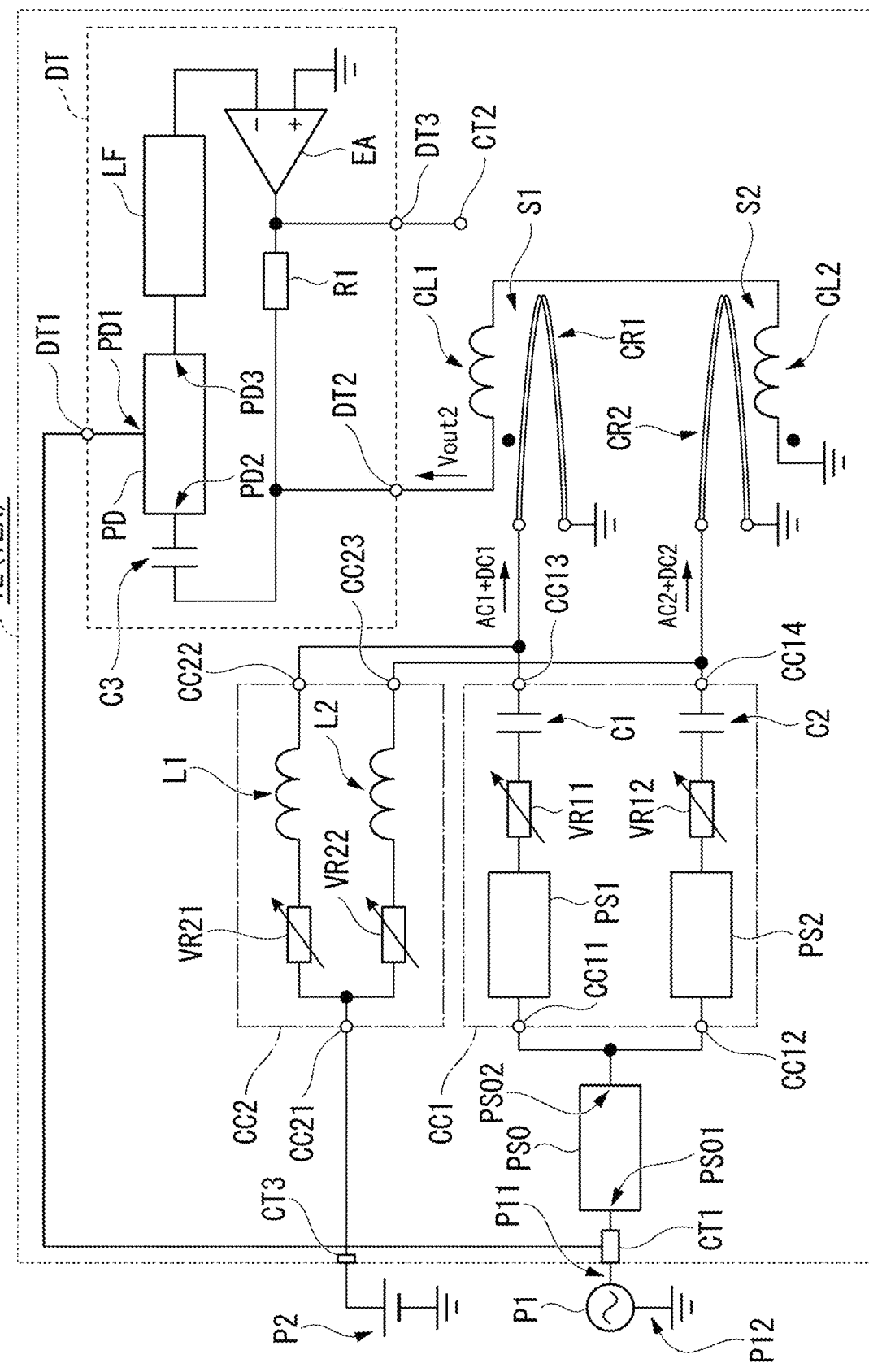
FIG. 6 is a diagram illustrating an example of a circuit configuration of a gradient magnetic field sensor 12A.

FIG. 6 is a diagram illustrating an example of a circuit configuration of the gradient magnetic field sensor 12A.

The gradient magnetic field sensor 12A includes a DC power supply connection terminal CT3 and a DC current control unit CC2 in addition to the AC power supply connection terminal CT1, the first sensor head S1, the second sensor head S2, the 0th phase shift circuit PS0, the AC current control unit CC1, the detection circuit DT, and the detection signal output terminal CT2. The DC current control unit CC2 includes an input terminal CC21, a first output terminal CC22, and a second output terminal CC23. In addition, the DC current control unit CC2 includes a first variable resistor VR21, a first inductor L1, a second variable resistor VR22, and a second inductor L2.

In addition, the gradient magnetic field sensor 12A is connected also to the DC power supply P2 in addition to the AC power supply P1 through a transmission line. More specifically, the DC power supply connection terminal CT3 included in the gradient magnetic field sensor 12A is connected to a positive power supply terminal included in the DC power supply P2 through a transmission line. A negative power supply terminal included in the DC power supply P2 is grounded through a transmission line. Here, the DC power supply P2 may be any DC power supply. In addition, between the DC power supply connection terminal CT3 and the positive power supply terminal, in a range in which a function of the gradient magnetic field sensor 12A is not damaged, another circuit element, another device, and the like may be configured to be connected. Furthermore, between this negative power supply terminal and the ground, in a range in which the function of the gradient magnetic field sensor 12A is not damaged, another circuit element, another device, and the like may be configured to be connected.

In addition, the DC power supply connection terminal CT3 is connected to the input terminal CC21 included in the DC current control unit CC2 through a transmission line. Furthermore, between the DC power supply connection terminal CT3 and the input terminal CC21, in a range in which the function of the gradient magnetic field sensor 12A is not damaged, another circuit element, another device, and the like may be configured to be connected.

In addition, in the DC current control unit CC2, between the input terminal CC21 and the first output terminal CC22, the first variable resistor VR21 and the first inductor L1 are connected in series through a transmission line. In the DC current control unit CC2, between the input terminal CC21 and the second output terminal CC23, the second variable resistor VR22 and the second inductor L2 are connected in series through a transmission line. In addition, between the input terminal CC21 and the first output terminal CC22, in a range in which the function of the gradient magnetic field sensor 12A is not damaged, another circuit element, another device, and the like may be configured to be connected together with the first variable resistor VR21 and the first inductor L1. Between the input terminal CC21 and the second output terminal CC23, in a range in which the function of the gradient magnetic field sensor 12A is not damaged, another circuit element, another device, and the like may be configured to be connected together with the second variable resistor VR22 and the second inductor L2. Between the input terminal CC21 and the first output terminal CC22, the first variable resistor VR21 and the first inductor L1 may be configured to be connected in series in any order. In addition, between the input terminal CC21 and the second output terminal CC23, the second variable resistor VR22 and the second inductor L2 may be configured to be connected in series in any order.

The first output terminal CC22 of the DC current control unit CC2 is connected to the transmission line connecting the first output terminal CC13 included in the AC current control unit CC1 and the first magnetic core CR1 through another transmission line. In addition, between the first output terminal CC22 and the transmission line connecting the first output terminal CC13 included in the AC current control unit CC1 and the first magnetic core CR1, in a range in which the function of the gradient magnetic field sensor 12A is not damaged, another circuit element, another device, and the like may be configured to be connected.

The second output terminal CC23 of the DC current control unit CC2 is connected to the transmission line connecting the second output terminal CC14 included in the AC current control unit CC1 and the second magnetic core CR2 through another transmission line. In addition, between the second output terminal CC23 and the transmission line connecting the second output terminal CC14 included in the AC current control unit CC1 and the second magnetic core CR2, in a range in which the function of the gradient magnetic field sensor 12 is not damaged, another circuit element, another device, and the like may be configured to be connected.

Next, an operation of the gradient magnetic field sensor 12A will be described.

In the gradient magnetic field sensor 12A having the circuit configuration as described above, the DC power supply P2 inputs a DC current to the DC power supply connection terminal CT3. The DC current input to the DC power supply connection terminal CT3 is input to the DC current control unit CC2 as a DC excitation current.

The DC excitation current input to the DC current control unit CC2 branches into two DC excitation currents including a first DC excitation current DC1 and a second DC excitation current DC2.

In the DC current control unit CC2, a magnitude of the first DC excitation current DC1 is adjusted by the first variable resistor VR21. Then, the first DC excitation current DC1 is input from the first output terminal CC22 to the first magnetic core CR1. In accordance with this, a voltage corresponding to the first AC excitation current AC1 that has flown through the first magnetic core CR1, the first DC excitation current DC1 that has flown through the first magnetic core CR1, and an intensity of a magnetic field applied to the first detection coil CL1 is induced in the first detection coil CL1. In other words, also in the gradient magnetic field sensor 12A, this voltage changes in accordance with the intensity of the magnetic field applied to the first detection coil CL1 from the outside. Hereinafter, for the convenience of description, this voltage will be referred to as a third induction voltage in description. The first inductor L1 is an inductor used for direct current (DC) coupling. In accordance with presence of the first inductor L1, in the gradient magnetic field sensor 12A, an AC current can be inhibited from flowing from the first output terminal CC22 to the input terminal CC21.

On the other hand, in the DC current control unit CC2, a magnitude of the second DC excitation current DC2 is adjusted by the second variable resistor VR22. Then, the second DC excitation current DC2 is input from the second output terminal CC23 to the second magnetic core CR2. In accordance with this, a voltage corresponding to the second AC excitation current AC2 that has flown through the second magnetic core CR2, the second DC excitation current DC2 that has flown through the second magnetic core CR2, and an intensity of a magnetic field applied to the second detection coil CL2 is induced in the second detection coil CL2. In other words, also in the gradient magnetic field sensor 12A, this voltage changes in accordance with the intensity of the magnetic field applied to the second detection coil CL2 from the outside. Hereinafter, for the convenience of description, this voltage will be referred to as a fourth induction voltage in description. The second inductor L2 is an inductor used for DC coupling. In accordance with presence of the second inductor L2, in the gradient magnetic field sensor 12A, an AC current can be inhibited from flowing from the second output terminal CC23 to the input terminal CC21.

In the gradient magnetic field sensor 12A, a signal corresponding to the third induction voltage and the fourth induction voltage induced in this way is input to the second input terminal DT2 included in the detection circuit DT as a differential signal Vout2. The phase detecting circuit PD of the detection circuit DT inputs a signal corresponding to a difference between the differential signal Vout2 input in this way and a reference signal input from the AC power supply P1 to the low pass filter LF as a wave detection signal. The low pass filter LF outputs an output signal acquired by eliminating components of a predetermined first frequency or a higher frequency from the wave detection signal input from the phase detecting circuit PD to the inverted input terminal of the error amplifier EA. The error amplifier EA outputs a signal corresponding to an electric potential difference between the electric potential of the output signal input to the inverted input terminal of the error amplifier EA and the ground electric potential to the detection signal output terminal CT2 and the resistor R1 as a detection signal.

The detection signal that has been input to the resistor R1 flows from the second input terminal DT2 to the first detection coil CL1 as a feedback current without being input to the third capacitor C3 in accordance with presence of a buffer circuit not illustrated in the drawing.

By performing adjustment on the detection circuit DT performing such an operation, in a case in which a signal level of the differential signal Vout2 is 0 [V], a detection signal of which a signal level is 0 [V] can be output from the detection signal output terminal CT2, and, in a case in which the signal level of the differential signal Vout2 is not 0 [V], a detection signal of which a signal level is not 0 [V] can be output from the detection signal output terminal CT2.

In accordance with the operation as described above, the gradient magnetic field sensor 12A detects a gradient. However, in a case in which adjustment for the third induction voltage and the fourth induction voltage is not performed, similar to the gradient magnetic field sensor 12 according to the embodiment, the gradient magnetic field sensor 12A may detect a gradient also inside a uniform magnetic field area. This leads to erroneous detection of presence of a detection target object regardless of absence of the detection target object, which is not desirable. Thus, DC current adjustment is performed on the gradient magnetic field sensor 12A together with the AC current adjustment described above. In accordance with this, the gradient magnetic field sensor 12A can improve detection accuracy for a detection target object using a magnetic field more reliably.

In other words, the DC current adjustment is adjustment causing a magnitude of a current flowing through the first magnetic core CR1 and a magnitude of a current flowing through the second magnetic core CR2 to coincide with each other. In other words, the DC current adjustment is adjustment causing the magnitude of the first DC excitation current DC1 and the magnitude of the second DC excitation current DC2 to be the same. Such DC current adjustment can be performed by adjusting at least one of a resistance value of the first variable resistor VR21 and a resistance value of the second variable resistor VR22.

In addition, the gradient magnetic field sensor 12A according to Modified example 1 of the embodiment may be configured not to include any one of the first variable resistor VR21 and the second variable resistor VR22. Furthermore, the gradient magnetic field sensor 12A according to Modified example 1 of the embodiment may be configured to include a resistance element of which a resistance value is not changeable in place of one of the first variable resistor VR21 and the second variable resistor VR22. The reason for this is that DC current adjustment can be performed by adjusting the magnitude of at least one of the first DC excitation current DC1 and the second DC excitation current DC2.

In addition, in a case in which a resistance element of the same resistance value as a resistance value of each of the first variable resistor VR21 and the second variable resistor VR22 described above can be prepared with results of in-advance tests or the like taken into account, the gradient magnetic field sensor 12A according to Modified example 1 of the embodiment may be configured to include a resistance element of which a resistance value is not able to be changed in place of one or both of the first variable resistor VR21 and the second variable resistor VR22.

Furthermore, the gradient magnetic field sensor 12A according to the embodiment may be configured not to include at least one of the first inductor L1 and the second inductor L2. Here, as described above, these are capacitors for DC coupling. For this reason, it is preferable that the gradient magnetic field sensor 12A include both the first inductor L1 and the second inductor L2.

As above, the gradient magnetic field sensor 12A according to Modified example 1 of the embodiment further includes: the DC power supply connection terminal CT3 to which the positive power supply terminal included in the DC power supply P2 is connected; the first variable resistor VR21 connected between the DC power supply connection terminal CT3 and the first magnetic core CR1; the first inductor L1 connected in series with the first variable resistor VR21 between the DC power supply connection terminal CT3 and the first magnetic core CR1; the second variable resistor VR22 connected between the DC power supply connection terminal CT3 and the second magnetic core CR2; and the second inductor L2 connected in series with the second variable resistor VR22 between the DC power supply connection terminal CT3 and the second magnetic core CR2 in addition to the members included in the gradient magnetic field sensor 12 according to the embodiment. In accordance with this, the gradient magnetic field sensor 12A can improve accuracy of detection of a detection target object using a magnetic field more reliably.

In addition, the gradient magnetic field sensor 12A may be configured to include a DC power supply P2 in which a negative power supply terminal included in the DC power supply P2 is grounded.

Modified Example 2 of Embodiment

Hereinafter, Modified example 2 of the embodiment will be described with reference to FIG. 7. In Modified example 2 of the embodiment, the same reference signs will be assigned to components similar to those of the embodiment, and description thereof will be omitted. Hereinafter, for the convenience of description, a gradient magnetic field sensor 12 according to Modified example 2 of the embodiment will be referred to as a gradient magnetic field sensor 12B. In addition, matters described in Modified example 2 of the embodiment may be applied to Modified example 1 of the embodiment. Furthermore, matters described in Modified example 2 of the embodiment may be applied not only to the embodiment but also to other modified examples of the embodiment to be described below.

The gradient magnetic field sensor 12B includes an AC current control unit CC3 in place of the AC current control unit CC1.

Figure 7:
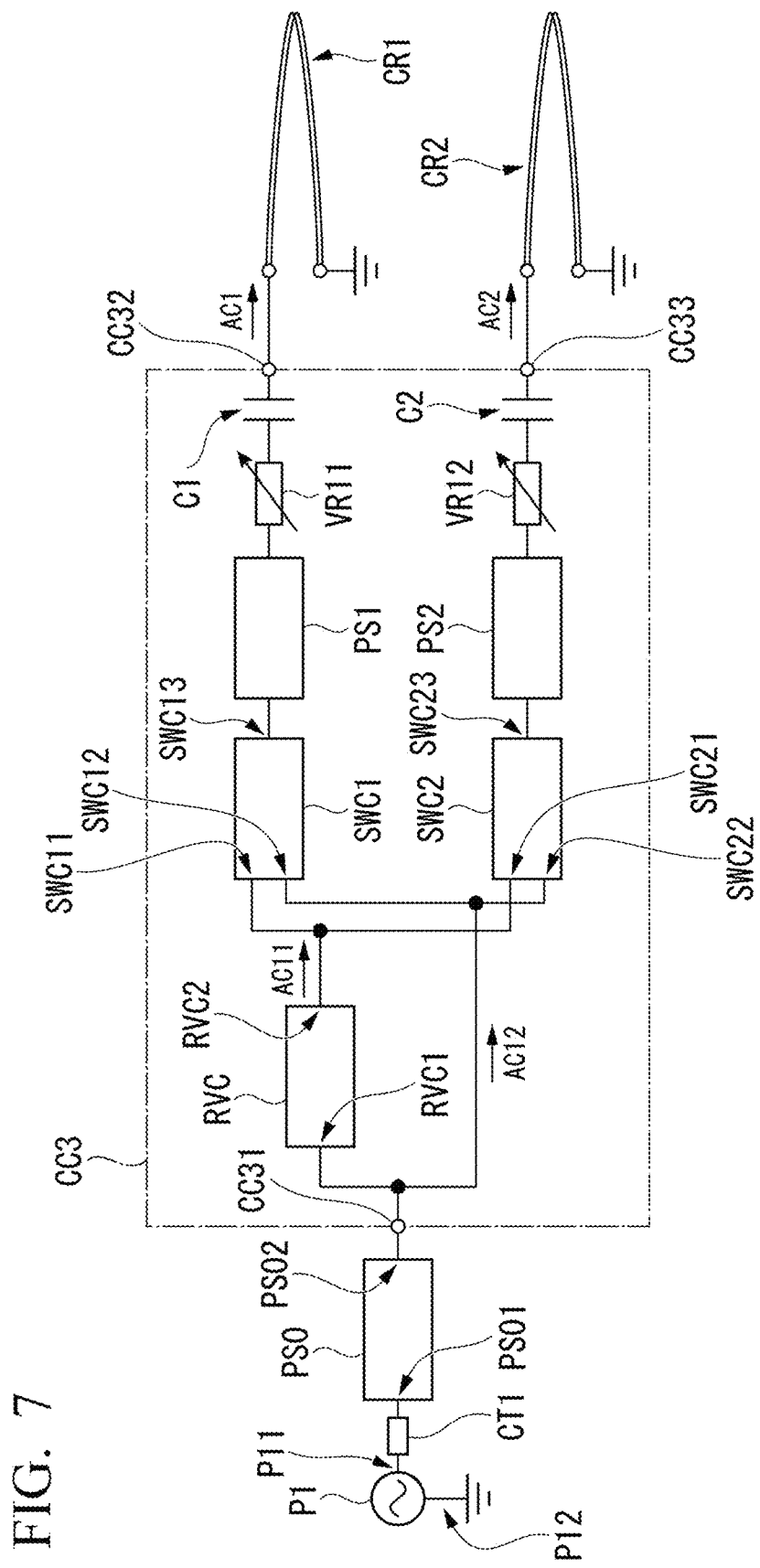
FIG. 7 is a diagram illustrating an example of a circuit configuration of an AC current control unit CC3.

FIG. 7 is a diagram illustrating an example of a circuit configuration of the AC current control unit CC3. In FIG. 7, in order to clearly represent connection forms of the AC current control unit CC3 and other members, the AC power supply P1, the AC power supply connection terminal CT1, the 0th phase shift circuit PS0, the first magnetic core CR1, and the second magnetic core CR2 are illustrated together with the AC current control unit CC3.

The AC current control unit CC3 includes an input terminal CC31, a first output terminal CC32, and a second output terminal CC33. In addition, the AC current control unit CC3 includes an inversion circuit RVC, a first switching circuit SWC1, a first phase shift circuit PS1, a first variable resistor VR11, a first capacitor C1, a second switching circuit SWC2, a second phase shift circuit PS2, a second variable resistor VR12, and a second capacitor C2. The inversion circuit RVC includes an input terminal RVC1 and an output terminal RVC2. The first switching circuit SWC1 includes a first input terminal SWC11, a second input terminal SWC12, and an output terminal SWC13. The second switching circuit SWC2 includes a first input terminal SWC21, a second input terminal SWC22, and an output terminal SWC23.

The input terminal CC31 included in the AC current control unit CC3 is connected to the output terminal PS02 included in the 0th phase shift circuit PS0 through a transmission line. In addition, between the input terminal CC31 and the output terminal PS02, in a range in which the function of the gradient magnetic field sensor 12B is not damaged, another circuit element, another device, and the like may be configured to be connected.

In the AC current control unit CC3, the input terminal CC31 is connected to the input terminal RVC1 included in the inversion circuit RVC, the second input terminal SWC12 included in the first switching circuit SWC1, and the second input terminal SWC22 included in the second switching circuit SWC2 through transmission lines. In addition, between the input terminal CC31 and the input terminal RVC1, in a range in which the function of the gradient magnetic field sensor 12B is not damaged, another circuit element, another device, and the like may be configured to be connected. Furthermore, between the input terminal CC31 and the second input terminal SWC12, in a range in which the function of the gradient magnetic field sensor 12B is not damaged, another circuit element, another device, and the like may be configured to be connected. In addition, between the input terminal CC31 and the second input terminal SWC22, in a range in which the function of the gradient magnetic field sensor 12B is not damaged, another circuit element, another device, and the like may be configured to be connected.

The output terminal RVC2 included in the inversion circuit RVC is connected to the first input terminal SWC11 included in the first switching circuit SWC1 and the first input terminal SWC21 included in the second switching circuit SWC2 through transmission lines. In addition, between the output terminal RVC2 and the first input terminal SWC11, in a range in which the function of the gradient magnetic field sensor 12B is not damaged, another circuit element, another device, and the like may be configured to be connected. Furthermore, between the output terminal RVC2 and the first input terminal SWC21, in a range in which the function of the gradient magnetic field sensor 12B is not damaged, another circuit element, another device, and the like may be configured to be connected.

Between the output terminal SWC13 included in the first switching circuit SWC1 and the first output terminal CC32 included in the AC current control unit CC3, the first phase shift circuit PS1, the first variable resistor VR11, and the first capacitor C1 are connected in series. Between the first output terminal CC32 and the ground, the first magnetic core CR1 of the first sensor head S1 is connected through a transmission line. In this case, the first AC excitation current AC1 is an AC current flowing from the first output terminal CC32 to the first magnetic core CR1. In addition, between the first output terminal CC32 included in the AC current control unit CC3 and the ground, in a range in which the function of the gradient magnetic field sensor 12B is not damaged, another circuit element, another device, and the like may be configured to be connected together with the first magnetic core CR1. Between the output terminal SWC13 and the first output terminal CC32, the first phase shift circuit PS1, the first variable resistor VR11, and the first capacitor C1 may be configured to be connected in series in any order.

Between the output terminal SWC23 included in the second switching circuit SWC2 and the second output terminal CC33 included in the AC current control unit CC3, the second phase shift circuit PS2, the second variable resistor VR12, and the second capacitor C2 are connected in series. Between the second output terminal CC33 and the ground, the second magnetic core CR2 of the second sensor head S2 is connected through a transmission line. In this case, the second AC excitation current AC2 is an AC current flowing from the second output terminal CC33 to the second magnetic core CR2. In addition, between the second output terminal CC33 included in the AC current control unit CC3 and the ground, in a range in which the function of the gradient magnetic field sensor 12B is not damaged, another circuit element, another device, and the like may be configured to be connected together with the second magnetic core CR2. Between the output terminal SWC23 and the second output terminal CC33, the second phase shift circuit PS2, the second variable resistor VR12, and the second capacitor C2 may be configured to be connected in series in any other.

Next, an operation of the AC current control unit CC3 will be described.

In the AC current control unit CC3 having the circuit configuration as described above, an AC current input from the input terminal CC31 branches into two AC currents.

One of the two AC currents acquired through branching is input to the inversion circuit RVC as an 11th AC excitation current AC11. In accordance with this, a phase of the 11th AC excitation current AC11 is inverted by the inversion circuit RVC. The 11th AC excitation current AC11 output from the inversion circuit RVC is input to the first input terminal SWC11 included in the first switching circuit SWC1 and the first input terminal SWC21 included in the second switching circuit SWC2.

On the other hand, the other of the two AC currents acquired through branching is input to the second input terminal SWC12 included in the first switching circuit SWC1 and the second input terminal SWC22 included in the second switching circuit SWC2 as an 12th AC excitation current AC12.

Here, the first switching circuit SWC1 outputs one of the input 11th AC excitation current AC11 and the input 12th AC excitation current AC12 to the first phase shift circuit PS1 as a first AC excitation current AC1. In addition, the second switching circuit SWC2 outputs one of the input 11th AC excitation current AC11 and the input 12th AC excitation current AC12 to the second phase shift circuit PS2 as a second AC excitation current AC2.

In other words, in the gradient magnetic field sensor 12B, by using the inversion circuit RVC, the first switching circuit SWC1, and the second switching circuit SWC2, it can be switched between the first AC excitation current AC1 and the second AC excitation current AC2 being currents of which phases are inverted and the first AC excitation current AC1 and the second AC excitation current AC2 being currents of which phases are the same. As a result, as the first phase shift circuit PS1 and the second phase shift circuit PS2, the gradient magnetic field sensor 12B may be configured to include phase shift circuits causing the phase to lead, may be configured to include phase shift circuits causing the phase to lag, or may be configured to include a phase shift circuit causing the phase to lag and a phase shift circuit causing the phase to lead. In other words, in accordance with the gradient magnetic field sensor 12B including the AC current control unit CC3, the gradient magnetic field sensor 12B can improve a degree of freedom of circuit design.

In addition, the gradient magnetic field sensor 12B may be configured not to include at least one of the first switching circuit SWC1 and the second switching circuit SWC2.

As above, in the gradient magnetic field sensor 12B according to Modified example 2 of the embodiment, the AC current control unit CC3 may be configured to include an inversion circuit RVC that inverts a phase of at least one of the first AC excitation current AC1 and the second AC excitation current AC2.

In addition, in the gradient magnetic field sensor 12B, the AC current control unit CC3 may be configured to include at least one of the first switching circuit SWC1 that performs switching of an AC current flowing through the first magnetic core CR1 as a first AC excitation current AC1 to one of an AC current of which a phase has been inverted by the inversion circuit RVC and an AC current of which a phase has not been inverted by the inversion circuit and the second switching circuit SWC2 that performs switching of an AC current flowing through the second magnetic core CR2 as a second AC excitation current AC2 to one of an AC current of which a phase has been inverted by the inversion circuit RVC and an AC current of which a phase has not been inverted by the inversion circuit RVC.

In accordance with this, the gradient magnetic field sensor 12B can improve a degree of freedom of circuit design.

Modified Example 3 of Embodiment

Hereinafter, Modified example 3 of the embodiment will be described with reference to FIG. 8. In Modified example 3 of the embodiment, the same reference signs will be assigned to components similar to those of the embodiment, and description thereof will be omitted. Hereinafter, for the convenience of description, a gradient magnetic field sensor 12 according to Modified example 2 of the embodiment will be referred to as a gradient magnetic field sensor 12C. In addition, matters described in Modified example 3 of the embodiment may be applied to Modified example 1 of the embodiment and Modified example 2 of the embodiment. Furthermore, matters described in Modified example 3 of the embodiment may be applied not only to the embodiment but also to other modified examples of the embodiment to be described below.

The detection circuit DT of the gradient magnetic field sensor 12C further includes a high pass filter HF.

Figure 8:
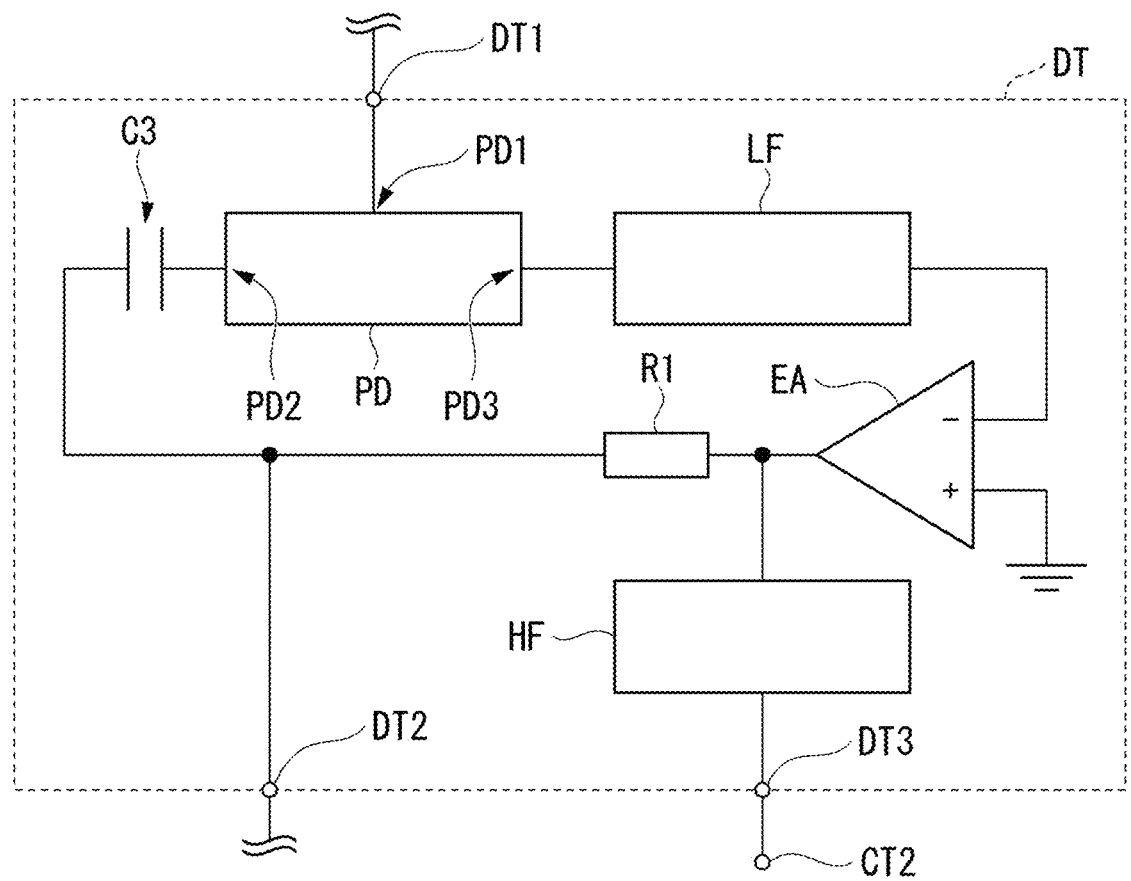
FIG. 8 is a diagram illustrating an example of a circuit configuration of a detection circuit DT further including a high pass filter HF.

FIG. 8 is a diagram illustrating an example of a circuit configuration of a detection circuit DT further including a high pass filter HF.

In the example illustrated in FIG. 8, in the detection circuit DT, between a transmission line connecting an error amplifier EA and a resistor R1 and an output terminal DT3, the high pass filter HF is connected through a transmission line. In addition, between the transmission line connecting the error amplifier EA and the resistor R1 and the high pass filter HF, in a range in which the function of the detection circuit DT is not damaged, another circuit element, another device, and the like may be configured to be connected. Furthermore, between the high pass filter HF and the output terminal DT3, in a range in which the function of the detection circuit DT is not damaged, another circuit element, another device, and the like may be configured to be connected.

The high pass filter HF outputs a signal acquired by eliminating components of a predetermined second frequency or a lower frequency from a detection signal output from the error amplifier EA to the output terminal DT3 as a new detection signal. In accordance with this, the gradient magnetic field sensor 12C can eliminate the offset component described above. As a result, the gradient magnetic field sensor 12C can improve accuracy of detection of a detection target object using a magnetic field more reliably.

As above, in the gradient magnetic field sensor 12C, the detection circuit DT may be configured to include a phase sensitive detector (PSD) circuit. The gradient magnetic field sensor 12C may be configured to include a high pass filter HF that eliminates components of a predetermined second frequency or a lower frequency from a signal output from a PLL circuit. In accordance with this, the gradient magnetic field sensor 12C can improve accuracy of detection of a detection target object using a magnetic field more reliably.

Modified Example 4 of Embodiment

Hereinafter, Modified example 4 of the embodiment will be described with reference to FIG. 9. In Modified example 4 of the embodiment, the same reference signs will be assigned to components similar to those of the embodiment, and description thereof will be omitted. Hereinafter, for the convenience of description, a gradient magnetic field sensor 12 according to Modified example 4 of the embodiment will be referred to as a gradient magnetic field sensor 12D. In addition, matters described in Modified example 4 of the embodiment may be applied to Modified example 1 of the embodiment, Modified example 2 of the embodiment, and Modified example 3 of the embodiment.

In Modified example 4 of the embodiment, similar to Modified example 2 of the embodiment, a DC excitation current flow through a first magnetic core CR1 and a second magnetic core CR2. However, different from the gradient magnetic field sensor 12A according to Modified example 1 of the embodiment, the gradient magnetic field sensor 12D according to Modified example 4 of the embodiment does not include the DC current control unit CC2.

Figure 9:
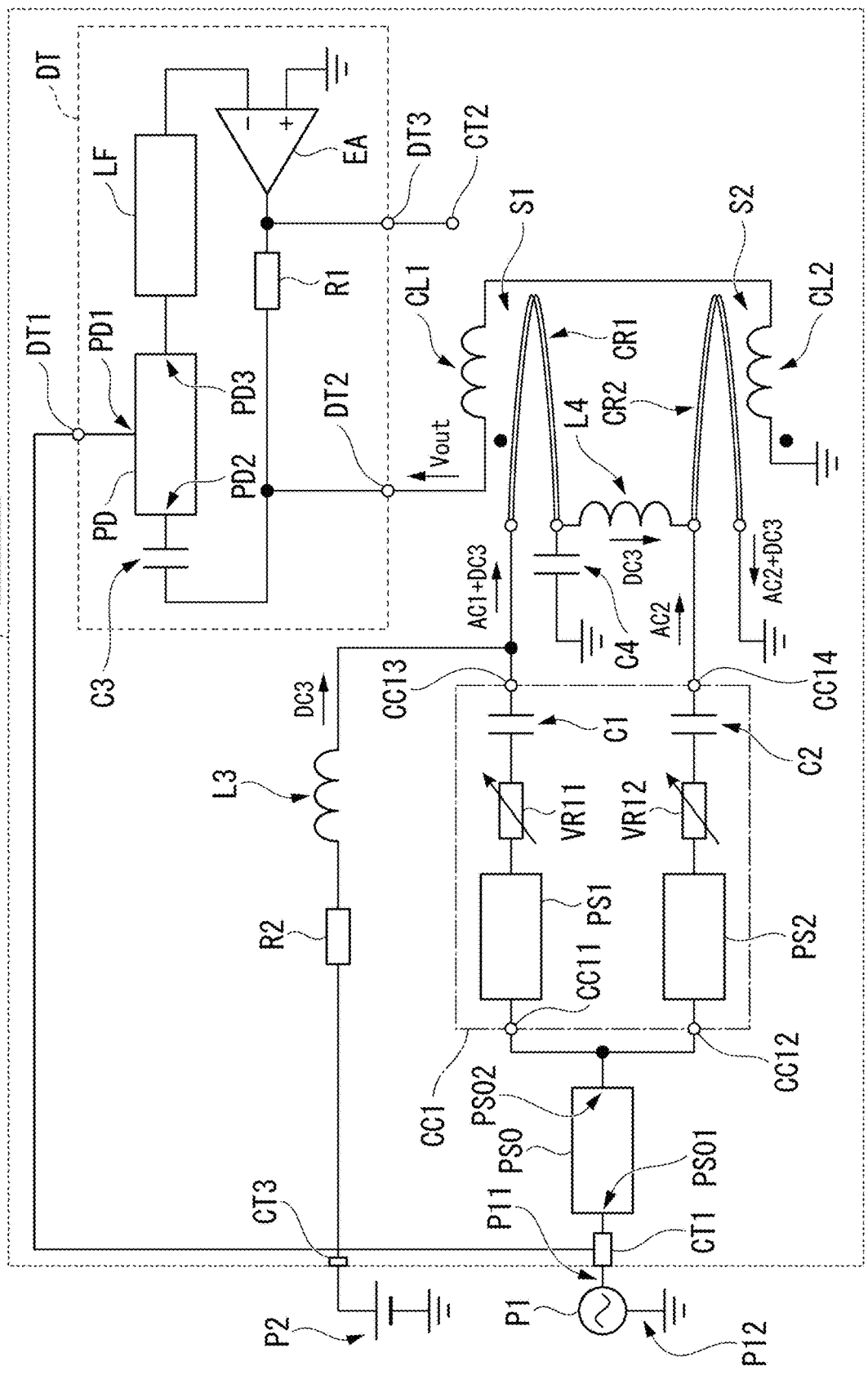
FIG. 9 is a diagram illustrating an example of a circuit configuration of a gradient magnetic field sensor 12D.

FIG. 9 is a diagram illustrating an example of a circuit configuration of the gradient magnetic field sensor 12D.

The gradient magnetic field sensor 12D includes a DC power supply connection terminal CT3, a resistor R2, a third inductor L3, a fourth inductor L4, and a fourth capacitor C4 in addition to the AC power supply connection terminal CT1, the first sensor head S1, the second sensor head S2, the 0th phase shift circuit PS0, the AC current control unit CC1, the detection circuit DT, and the detection signal output terminal CT2.

The gradient magnetic field sensor 12D is connected also to the DC power supply P2 in addition to the AC power supply P1 through a transmission line. More specifically, the DC power supply connection terminal CT3 included in the gradient magnetic field sensor 12D is connected to a positive power supply terminal included in the DC power supply P2 through a transmission line. A negative power supply terminal included in the DC power supply P2 is grounded through a transmission line. Here, the DC power supply P2 may be any DC power supply. In addition, between the DC power supply connection terminal CT3 and this positive power supply terminal, in a range in which the function of the gradient magnetic field sensor 12D is not damaged, another circuit element, another device, and the like may be configured to be connected. Furthermore, between this negative power supply terminal and the ground, in a range in which the function of the gradient magnetic field sensor 12D is not damaged, another circuit element, another device, and the like may be configured to be connected.

The DC power supply connection terminal CT3 is connected to one of two terminals included in the resistor R2 through a transmission line. In addition, the other of the two terminals included in the resistor R2 is connected to one of two terminals included in the third inductor L3 through a transmission line. The other of the two terminals included in the third inductor L3 is connected to a transmission line connecting the first output terminal CC13 included in the AC current control unit CC1 and the first magnetic core CR1 through another transmission line. In addition, between the DC power supply connection terminal CT3 and the resistor R2, in a range in which the function of the gradient magnetic field sensor 12D is not damaged, another circuit element, another device, and the like may be configured to be connected. Furthermore, between the resistor R2 and the third inductor L3, in a range in which the function of the gradient magnetic field sensor 12D is not damaged, another circuit element, another device, and the like may be configured to be connected. In addition, between the third inductor L3 and the transmission line connecting the first output terminal CC13 included in the AC current control unit CC1 and the first magnetic core CR1, in a range in which the function of the gradient magnetic field sensor 12D is not damaged, another circuit element, another device, and the like may be configured to be connected. The third inductor L3 is an inductor used for DC coupling. In accordance with presence of the third inductor L3, in the gradient magnetic field sensor 12D, an AC current can be inhibited from flowing from the transmission line connecting the first output terminal CC13 included in the AC current control unit CC1 and the first magnetic core CR1 to the DC power supply connection terminal CT3.

In addition, between the first output terminal CC13 included in the AC current control unit CC1 and the ground, the first magnetic core CR1 and the fourth capacitor C4 are connected in series in order of the first magnetic core CR1 and the fourth capacitor C4 from the first output terminal CC13 side to the ground side. This fourth capacitor C4 is a capacitor used for AC coupling. In addition, between the transmission line connecting the first magnetic core CR1 and the fourth capacitor C4 and the transmission line connecting the second output terminal CC14 included in the AC current control unit CC1 and the second magnetic core CR2, the fourth inductor L4 is connected through another transmission line. This fourth inductor L4 is an inductor used for DC coupling. In addition, between the first magnetic core CR1 and the fourth capacitor C4, in a range in which the function of the gradient magnetic field sensor 12D is not damaged, another circuit element, another device, and the like may be configured to be connected. Furthermore, between the fourth capacitor C4 and the ground, in a range in which the function of the gradient magnetic field sensor 12D is not damaged, another circuit element, another device, and the like may be configured to be connected. In addition, between the transmission line connecting the first magnetic core CR1 and the fourth capacitor C4 and the fourth inductor L4, in a range in which the function of the gradient magnetic field sensor 12D is not damaged, another circuit element, another device, and the like may be configured to be connected. Furthermore, between the fourth inductor L4 and the transmission line connecting the second output terminal CC14 and the second magnetic core CR2, in a range in which the function of the gradient magnetic field sensor 12D is not damaged, another circuit element, another device, and the like may be configured to be connected.

Next, an operation of the gradient magnetic field sensor 12D will be described.

In the gradient magnetic field sensor 12D having the circuit configuration as described above, the DC power supply P2 inputs a DC current to the DC power supply connection terminal CT3. The DC current input to the DC power supply connection terminal CT3 is input to the first magnetic core CR1 through the resistor R2 and the third inductor L3 as a DC excitation current DC3. For this reason, the DC excitation current DC3 flows through the first magnetic core CR1 together with the first AC excitation current AC1. In addition, the DC excitation current DC3 input to the first magnetic core CR1 is also input to the second magnetic core CR2 through the fourth inductor L4. For this reason, the DC excitation current DC3 flows through the second magnetic core CR2 together with the second AC excitation current AC2. The first AC excitation current AC1 hardly flows from the first magnetic core CR1 to the second magnetic core CR2 in accordance with the fourth capacitor C4 and the fourth inductor L4. Similarly, the second AC excitation current AC2 hardly flows from the second magnetic core CR2 to the first magnetic core CR1 in accordance with the fourth inductor L4.

In this way, in the gradient magnetic field sensor 12D, the DC excitation current DC3 that is a DC current of the same magnitude can be caused to flow through each of the first magnetic core CR1 and the second magnetic core CR2. In accordance with this, the gradient magnetic field sensor 12D can improve accuracy of detection of a detection target object using a magnetic field more reliably by using a circuit configuration simpler than that of Modified example 2 of the embodiment.

Figure 10:
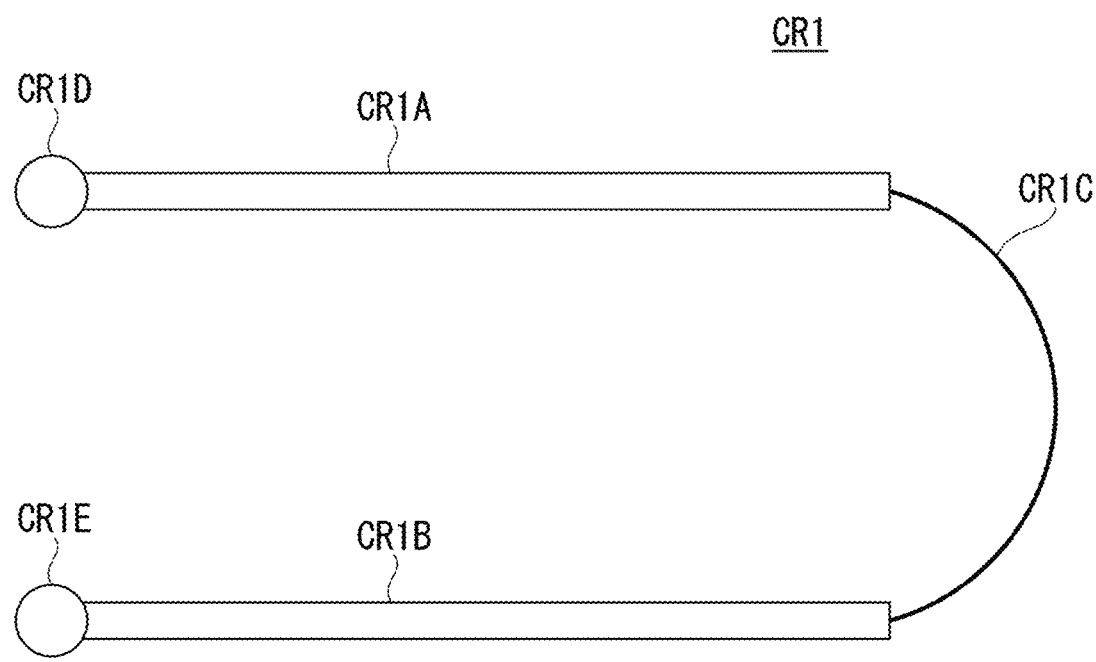
FIG. 10 is a diagram illustrating an example of a configuration of a first magnetic core CR1 including a plurality of magnetic bodies.

The first magnetic core CR1 described above may be configured to include two or more magnetic bodies connected in series. In this case, in the first magnetic core CR1, at least one of these two or more magnetic bodies may be configured to be connected in series using non-magnetic conductors. Here, FIG. 10 is a diagram illustrating an example of a configuration of the first magnetic core CR1 including a plurality of magnetic bodies. In the example illustrated in FIG. 10, the first magnetic core CR1 includes two magnetic bodies. More specifically, in this example, the first magnetic core CR1 includes a magnetic body CR1A, a magnetic body CR1B, a nonmagnetic conductor CR1C, a terminal CR1D, and a terminal CR1E. The magnetic body CR1A and the magnetic body CR1B are connected using the conductor CR1C. In addition, the terminal CR1D is disposed at an end among ends included in the magnetic body CR1A that is on a side opposite to an end connected to the conductor CR1C. For example, in FIG. 2, the terminal CR1D is a terminal that is connected to the first output terminal CC13 of the AC current control unit CC1. In addition, the terminal CR1E is disposed at an end among ends included in the magnetic body CR1B that is on a side opposite to an end connected to the conductor CR1C. For example, in FIG. 2, the terminal CR1E is a terminal that is grounded.

In addition, the second magnetic core CR2 described above may be configured to include two or more magnetic bodies connected in series. In this case, in the second magnetic core CR2, at least one of these two or more magnetic bodies may be configured to be connected in series using nonmagnetic conductors. The configuration of the second magnetic core CR2 including a plurality of magnetic bodies is a configuration similar to the configuration of the first magnetic core CR1 including a plurality of magnetic bodies, and thus description using illustration will be omitted.

As above, a gradient magnetic field sensor according to an embodiment (in the example described above, the gradient magnetic field sensor 12, the gradient magnetic field sensor 12A, the gradient magnetic field sensor 12B, the gradient magnetic field sensor 12C, and the gradient magnetic field sensor 12D) includes: an AC power supply connection terminal (in the example described above, the AC power supply connection terminal CT1) to which a first power supply terminal (in the example described above, the first power supply terminal P11) included in an AC power supply (in the example described above, the AC power supply P1) is connected; a first magnetic core (in the example described above, the first magnetic core CR1) connected between the AC power supply connection terminal and the ground; a second magnetic core (in the example described above, the second magnetic core CR2) connected in parallel with the first magnetic core between the AC power supply connection terminal and the ground; an AC current control unit (in the example described above, the AC current control unit CC1 and the AC current control unit CC3) connected between the AC power supply connection terminal and at least one of the first magnetic core and the second magnetic core and configured to control an AC current (in the example described above, the first AC excitation current AC1) flowing through at least one of the first magnetic core and the second magnetic core; a first detection coil (in the example described above, the first detection coil CL1) wound around the first magnetic core; a second detection coil (in the example described above, the second detection coil CL2) wound around the second magnetic core and is differentially-connected with the first detection coil; and a detection circuit (in the example described above, the detection circuit DT) that detects a voltage corresponding to a difference between a first voltage (in the example described, the first induction voltage and the third induction voltage) output from the first detection coil and a second voltage (in the example described above, the second induction voltage and the fourth induction voltage) output from the second detection coil. In accordance with this, the gradient magnetic field sensor can improve accuracy of detection of a detection target object using a magnetic field.

In addition, the gradient magnetic field sensor may be configured to include an AC power supply in which the second power supply terminal included in the AC power supply is connected to the ground.

Furthermore, in the gradient magnetic field sensor, the AC current control unit may be configured to include a phase shift unit (in the example described above, at least one of the first phase shift circuit PS1 and the second phase shift circuit PS2) that shifts a phase of at least one of a first AC current (in the example described above, the first AC excitation current AC1) flowing from the AC power supply connection terminal to the first magnetic core and a second AC current (in the example described above, the second AC excitation current AC2) flowing from the AC power supply connection terminal to the second magnetic core.

In addition, in the gradient magnetic field sensor, the AC current control unit may be configured to include an amplitude adjusting unit (in the example described above, at least one of the first variable resistor VR11 and the second variable resistor VR12) that adjusts an amplitude of at least one of a first AC current flowing from the AC power supply connection terminal to the first magnetic core and a second AC current flowing from the AC power supply connection terminal to the second magnetic core.

Furthermore, in the gradient magnetic field sensor, the AC current control unit may be configured to include at least one of a first amplification circuit connected between the AC power supply connection terminal and the first magnetic core and an 11th variable resistor (in the example described above, the first variable resistor VR11) and at least one of a second amplification circuit connected between the AC power supply connection terminal and the second magnetic core and a 12th variable resistor (in the example described above, the second variable resistor VR12) as amplitude adjusting units.

In addition, in the gradient magnetic field sensor, the AC current control unit may be configured to include an inversion circuit (in the example described above, the inversion circuit RVC) that inverts a phase of at least one of a first AC current flowing from the AC power supply connection terminal to the first magnetic core and a second AC current flowing from the AC power supply connection terminal to the second magnetic core.

Furthermore, in the gradient magnetic field sensor, the AC current control unit may be configured to include at least one of a first switching circuit (in the example described above, the first switching circuit SWC1) that switches an AC current flowing through the first magnetic core as a first AC current to one of an AC current (in the example described above, the 11th AC excitation current AC11) acquired by inverting the phase using an inversion circuit and an AC current (in the example described above, the 12th AC excitation current AC12) acquired by not inverting the phase using an inversion circuit and a second switching circuit (in the example described above, the second switching circuit SWC2) that switches an AC current flowing through the second magnetic core as a second AC current to one of an AC current acquired by inverting the phase using an inversion circuit and an AC current acquired by not inverting the phase using an inversion circuit In addition, in the gradient magnetic field sensor, the AC current control unit may be configured to include a first capacitor (in the example described above, the first capacitor C1) for AC coupling that is connected between the AC power supply connection terminal and the first magnetic core and a second capacitor (in the example described above, the second capacitor C2) for AC coupling that is connected between the AC power supply connection terminal and the second magnetic core.

In addition, the gradient magnetic field sensor may be configured to further include: a DC power supply connection terminal (in the example described above, the DC power supply connection terminal CT3) to which a positive power supply terminal included in a DC power supply (in the example described above, the DC power supply P2) is connected; a 21st resistor (in the example described above, the first variable resistor VR21) connected between the DC power supply connection terminal and the first magnetic core; a first inductor (in the example described above, the first inductor L1) connected in series with the 21st resistor between the DC power supply connection terminal and the first magnetic core; a 22nd resistor (in the example described above, the second variable resistor VR22) connected between the DC power supply connection terminal and the second magnetic core; and a second inductor (in the example described above, the second inductor L2) connected in series with the 22nd resistor between the DC power supply connection terminal and the second magnetic core.

Furthermore, in the gradient magnetic field sensor, at least one of the 21st resistor and the 22nd resistor may be configured to be a variable resistor.

In addition, the gradient magnetic field sensor may be configured to include a DC power supply in which a negative power supply terminal included in the DC power supply is connected to the ground.

Furthermore, in the gradient magnetic field sensor, the detection circuit may be configured to include a phase sensitive detector (PSD) circuit.

In addition, in the gradient magnetic field sensor, the detection circuit may be configured to include a low pass filter (in the example described above, the low pass filter LF) that eliminates components of a predetermined first frequency or a higher frequency from a signal output from the PSD circuit.

Furthermore, in the gradient magnetic field sensor, the detection circuit may be configured to include a high pass filter (in the example described above, the high pass filter HF) that eliminates components of a predetermined second frequency or a lower frequency from a signal output from the PSD circuit.

In addition, a magnetic matter detection device according to an embodiment (in the example described above, the magnetic matter detection device 1) includes the gradient magnetic field sensor described above. In accordance with this, the magnetic matter detection device can improve accuracy of detection of a detection target object using a magnetic field.

As above, although the embodiment of the present invention has been described in detail with reference to the drawings, a specific configuration is not limited to this embodiment, and changes, substitutions, deletion, and the like may be made therein as long as the configuration does not depart from the gist of the present invention.

REFERENCE SIGNS LIST

1 Magnetic matter detection device
11 Magnetization device
12, 12A, 12B, 12C, 12D Gradient magnetic field sensor
20 Information processing device
AC1 First AC excitation current
AC2 Second AC excitation current
AC11 11th AC excitation current
AC12 12th AC excitation current
C1 First capacitor
C2 Second capacitor
C3 Third capacitor
C4 Fourth capacitor
CC1, CC3 AC current control unit
CC2 DC current control unit
CL1 First detection coil
CL2 Second detection coil
CR1 First magnetic core
CR2 Second magnetic core
CS Frame body
CT1 AC power supply connection terminal CT2 Detection signal output terminal
CT3 DC power supply connection terminal
DT Detection circuit
DC1 First DC excitation current
DC2 Second DC excitation current
DC3 DC Excitation current
EA Error amplifier
HF High pass filter
L1 First inductor
L2 Second inductor
L3 Third inductor
L4 Fourth inductor
LF Low pass filter
P1 AC power supply
P2 DC power supply
PD Phase detecting circuit
PS0 0th phase shift circuit
PS1 First phase shift circuit
PS2 Second phase shift circuit
R1, R2 Resistor
RL1 First roller
RL2 Second roller
RVC Inversion circuit
S1 First sensor head
S2 Second sensor head
ST Sheet member
SWC1 First switching circuit
SWC2 Second switching circuit
Vout Differential signal
Vout2 Differential signal
VR11, VR21 First variable resistor
VR12, VR22 Second variable resistor

The invention claimed is:

1. A gradient magnetic field sensor comprising:
an AC power supply connection terminal to which a first power supply terminal included in an AC power supply is connected;
a first magnetic core connected between the AC power supply connection terminal and the ground;
a second magnetic core connected in parallel with the first magnetic core between the AC power supply connection terminal and the ground;
an AC current control unit connected between the AC power supply connection terminal and at least one of the first magnetic core and the second magnetic core and configured to control an AC current flowing through at least one of the first magnetic core and the second magnetic core;
a first detection coil wound around the first magnetic core;
a second detection coil wound around the second magnetic core and differentially connected with the first detection coil; and
a detection circuit configured to detect a voltage corresponding to a difference between a first voltage output from the first detection coil and a second voltage output from the second detection coil,
wherein the AC current control unit includes a phase shift unit configured to shift a phase of at least one of a first AC current flowing from the AC power supply connection terminal to the first magnetic core and a second AC current flowing from the AC power supply connection terminal to the second magnetic core.

2. The gradient magnetic field sensor according to claim 1, further comprising the AC power supply in which a second power supply terminal included in the AC power supply is grounded.

3. The gradient magnetic field sensor according to claim 1, wherein the AC current control unit includes an amplitude adjusting unit configured to adjust an amplitude of at least one of the first AC current flowing from the AC power supply connection terminal to the first magnetic core and the second AC current flowing from the AC power supply connection terminal to the second magnetic core.

4. The gradient magnetic field sensor according to claim 3, wherein the AC current control unit includes at least one of a first amplification circuit and an 1st variable resistor connected between the AC power supply connection terminal and the first magnetic core and at least one of a second amplification circuit and a 2nd variable resistor connected between the AC power supply connection terminal and the second magnetic core as the amplitude adjusting unit.

5. The gradient magnetic field sensor according to claim 1, wherein the AC current control unit includes an inversion circuit configured to invert a phase of at least one of a first AC current flowing from the AC power supply connection terminal to the first magnetic core and a second AC current flowing from the AC power supply connection terminal to the second magnetic core.

6. The gradient magnetic field sensor according to claim 5, wherein the AC current control unit includes at least one of a first switching circuit configured to perform switching of an AC current flowing through the first magnetic core as the first AC current to one of an AC current acquired by inverting a phase using the inversion circuit and an AC current acquired by not inverting the phase using the inversion circuit and a second switching circuit configured to perform switching of an AC current flowing through the second magnetic core as the second AC current to one of an AC current acquired by inverting a phase using the inversion circuit and an AC current acquired by not inverting the phase using the inversion circuit.

7. The gradient magnetic field sensor according to claim 1, wherein the AC current control unit includes a first capacitor for AC coupling connected between the AC power supply connection terminal and the first magnetic core and a second capacitor for AC coupling connected between the AC power supply connection terminal and the second magnetic core.

8. The gradient magnetic field sensor according to claim 1, further comprising:
a DC power supply connection terminal to which a positive power supply terminal included in a DC power supply is connected;
a 1st resistor configured to be connected between the DC power supply connection terminal and the first magnetic core;
a first inductor configured to be connected in series with the 1st resistor between the DC power supply connection terminal and the first magnetic core;
a 2nd resistor configured to be connected between the DC power supply connection terminal and the second magnetic core; and
a second inductor configured to be connected in series with the 2nd resistor between the DC power supply connection terminal and the second magnetic core.

9. The gradient magnetic field sensor according to claim 8, wherein at least one of the 1st resistor and the 2nd resistor is a variable resistor.

10. The gradient magnetic field sensor according to claim 8, further comprising the DC power supply in which a negative power supply terminal included in the DC power supply is grounded.

11. A magnetic matter detection device comprising the gradient magnetic field sensor according to claim 1.

12. A gradient magnetic field sensor comprising:

an AC power supply connection terminal to which a first power supply terminal included in an AC power supply is connected;

a first magnetic core connected between the AC power supply connection terminal and the ground;

a second magnetic core connected in parallel with the first magnetic core between the AC power supply connection terminal and the ground;

an AC current control unit connected between the AC power supply connection terminal and at least one of the first magnetic core and the second magnetic core and configured to control an AC current flowing through at least one of the first magnetic core and the second magnetic core;

a first detection coil wound around the first magnetic core;

a second detection coil wound around the second magnetic core and differentially connected with the first detection coil; and a detection circuit configured to detect a voltage corresponding to a difference between a first voltage output from the first detection coil and a second voltage output from the second detection coil, wherein the detection circuit includes a PSD (Phase Sensitive Detector) circuit, and the detection circuit includes a high pass filter configured to eliminate components of a predetermined second frequency or a lower frequency from a signal output from the PSD circuit.

13. The gradient magnetic field sensor according to claim 12, wherein the detection circuit includes a low pass filter configured to eliminate components of a predetermined first frequency or a higher frequency from a signal output from the PSD circuit.

* * * * *